US010935891B2

(12) United States Patent
Lin et al.

(10) Patent No.: US 10,935,891 B2
(45) Date of Patent: Mar. 2, 2021

(54) MULTI WAVELENGTH STEREOLITHOGRAPHY HARDWARE CONFIGURATIONS

(71) Applicant: Holo, Inc., Oakland, CA (US)

(72) Inventors: Pierre Lin, San Rafael, CA (US); Arian Aghababaie, San Rafael, CA (US); Richard Greene, San Rafael, CA (US); Brian Adzima, San Rafael, CA (US); Jonathan Pomeroy, San Rafael, CA (US)

(73) Assignee: Holo, Inc., Newark, CA (US)

( * ) Notice: Subject to any disclaimer, the term of this patent is extended or adjusted under 35 U.S.C. 154(b) by 226 days.

(21) Appl. No.: 15/919,124

(22) Filed: Mar. 12, 2018

(65) Prior Publication Data
US 2018/0348646 A1     Dec. 6, 2018

Related U.S. Application Data

(60) Provisional application No. 62/470,813, filed on Mar. 13, 2017.

(51) Int. Cl.
*G03F 7/20* (2006.01)
*B29C 64/282* (2017.01)
(Continued)

(52) U.S. Cl.
CPC ........ *G03F 7/70416* (2013.01); *B29C 64/129* (2017.08); *B29C 64/268* (2017.08);
(Continued)

(58) Field of Classification Search
None
See application file for complete search history.

(56) References Cited

U.S. PATENT DOCUMENTS

| 4,252,887 A | 2/1981 | Dessauer et al. |
| 4,269,933 A | 5/1981 | Pazos et al. |

(Continued)

FOREIGN PATENT DOCUMENTS

| CN | 1418974 A | 5/2003 |
| CN | 101956091 A | 1/2011 |

(Continued)

OTHER PUBLICATIONS

Co-pending U.S. Appl. No. 16/457,380, filed Jun. 28, 2019.
(Continued)

*Primary Examiner* — Michael P. Rodriguez
(74) *Attorney, Agent, or Firm* — Wilson, Sonsini, Goodrich and Rosati

(57) ABSTRACT

The present disclosure provides methods, systems, and apparatuses relating to hardware configurations for performing multi-wavelength three dimensional (3D) printing using photoinhibition. In at least one aspect, a system for 3D printing comprises a reservoir capable of holding a liquid including a photoactive resin, a build head that undergoes relative motion within the reservoir during 3D printing of a 3D object on the build head, a light projection device that projects a photoinitiation light beam at a first wavelength into a build area within the liquid, and a plurality of light sources arranged with respect to the light projection device and the reservoir that project a plurality of photoinhibiting light beams into the build area at a second wavelength. Each of the plurality of photoinhibition light beams may be projected at a peak intensity in a different respective position in the build area.

28 Claims, 6 Drawing Sheets

(51) Int. Cl.
    *G03F 7/00*           (2006.01)
    *B29C 64/393*       (2017.01)
    *B29C 64/268*       (2017.01)
    *B29C 64/129*       (2017.01)
    *B33Y 10/00*        (2015.01)
    *B33Y 30/00*        (2015.01)
    *B33Y 50/02*        (2015.01)

(52) U.S. Cl.
    CPC .......... *B29C 64/282* (2017.08); *B29C 64/393* (2017.08); *B33Y 10/00* (2014.12); *B33Y 30/00* (2014.12); *B33Y 50/02* (2014.12); *G03F 7/0037* (2013.01)

(56) References Cited

U.S. PATENT DOCUMENTS

| | | |
|---|---|---|
| 4,801,477 A | 1/1989 | Fudim |
| 4,814,370 A | 3/1989 | Kramer et al. |
| 4,961,154 A | 10/1990 | Pomerantz et al. |
| 5,137,662 A | 8/1992 | Hull et al. |
| 5,143,668 A | 9/1992 | Hida et al. |
| 5,182,056 A | 1/1993 | Spence et al. |
| 5,184,307 A | 2/1993 | Hull et al. |
| 5,236,326 A | 8/1993 | Grossa |
| 5,248,456 A | 9/1993 | Evans, Jr. et al. |
| 5,330,701 A | 7/1994 | Shaw et al. |
| 5,474,719 A | 12/1995 | Fan et al. |
| 5,531,958 A | 7/1996 | Krueger |
| 5,545,367 A | 8/1996 | Bae et al. |
| 5,656,297 A | 8/1997 | Bernstein et al. |
| 5,676,745 A | 10/1997 | Kelly et al. |
| 5,877,270 A | 3/1999 | Takayama et al. |
| 5,922,507 A | 7/1999 | Van et al. |
| 5,998,496 A | 12/1999 | Hassoon et al. |
| 6,090,865 A | 7/2000 | Dudman et al. |
| 6,093,761 A | 7/2000 | Schofalvi et al. |
| 6,100,007 A | 8/2000 | Pang et al. |
| 6,204,316 B1 | 3/2001 | Schofalvi et al. |
| 6,259,962 B1 | 7/2001 | Gothait |
| 6,376,585 B1 | 4/2002 | Schofalvi et al. |
| 6,658,314 B1 | 12/2003 | Gothait |
| 6,664,354 B2 | 12/2003 | Savu et al. |
| 6,780,472 B2 | 8/2004 | Hamrock et al. |
| 6,833,043 B1 | 12/2004 | Parsonage et al. |
| 6,846,862 B2 | 1/2005 | Schofalvi et al. |
| 6,850,334 B1 | 2/2005 | Gothait |
| 6,852,781 B2 | 2/2005 | Savu et al. |
| 7,022,410 B2 | 4/2006 | Tonapi et al. |
| 7,079,915 B2 | 7/2006 | Huang et al. |
| 7,101,618 B2 | 9/2006 | Coggio et al. |
| 7,173,778 B2 | 2/2007 | Jing et al. |
| 7,195,472 B2 | 3/2007 | John |
| 7,209,797 B2 | 4/2007 | Kritchman et al. |
| 7,223,826 B2 | 5/2007 | Ali et al. |
| 7,267,850 B2 | 9/2007 | Coggio et al. |
| 7,288,469 B2 | 10/2007 | Sharma et al. |
| 7,288,514 B2 | 10/2007 | Scheuing et al. |
| 7,332,217 B2 | 2/2008 | Coggio et al. |
| 7,417,099 B2 | 8/2008 | Savu et al. |
| 7,433,627 B2 | 10/2008 | German et al. |
| 7,438,846 B2 | 10/2008 | John |
| 7,491,441 B2 | 2/2009 | Pokorny et al. |
| 7,511,008 B2 | 3/2009 | Scheuing et al. |
| 7,575,847 B2 | 8/2009 | Jing et al. |
| 7,632,560 B2 | 12/2009 | Filippini et al. |
| 7,662,896 B2 | 2/2010 | Savu et al. |
| 7,718,264 B2 | 5/2010 | Klun et al. |
| 7,845,930 B2 | 12/2010 | Shkolnik et al. |
| 7,907,878 B2 | 3/2011 | Takagi et al. |
| 7,912,411 B2 | 3/2011 | Takagi et al. |
| 7,961,154 B2 | 6/2011 | Qi et al. |
| 8,110,135 B2 | 2/2012 | El-Siblani |
| 8,133,551 B2 | 3/2012 | Claes |
| 8,147,966 B2 | 4/2012 | Klun et al. |
| 8,372,330 B2 | 2/2013 | El-Siblani et al. |
| 8,372,913 B2 | 2/2013 | Claes |
| 8,394,313 B2 | 3/2013 | Shkolnik et al. |
| 8,476,398 B2 | 7/2013 | Klun et al. |
| 8,551,285 B2 | 10/2013 | Ho et al. |
| 8,623,264 B2 | 1/2014 | Rohner et al. |
| 8,696,971 B2 | 4/2014 | Boot et al. |
| 8,716,377 B2 | 5/2014 | Taden et al. |
| 8,729,211 B2 | 5/2014 | Klun et al. |
| 8,734,715 B2 | 5/2014 | Miller et al. |
| 8,741,203 B2 | 6/2014 | Liska et al. |
| 8,753,464 B2 | 6/2014 | Khanna |
| 8,753,714 B2 | 6/2014 | Cheung et al. |
| 8,801,418 B2 | 8/2014 | El-Siblani et al. |
| 8,829,070 B2 | 9/2014 | Morita et al. |
| 8,859,642 B2 | 10/2014 | Miyamoto |
| 8,916,335 B2 | 12/2014 | Kitano et al. |
| 9,108,358 B1 | 8/2015 | Herloski et al. |
| 9,120,270 B2 | 9/2015 | Chen et al. |
| 9,205,601 B2 | 12/2015 | Desimone et al. |
| 9,211,678 B2 | 12/2015 | Desimone et al. |
| 9,216,546 B2 | 12/2015 | Desimone et al. |
| 9,306,218 B2 | 4/2016 | Pyun et al. |
| 9,360,757 B2 | 6/2016 | Desimone et al. |
| 9,367,049 B2 | 6/2016 | Jariwala et al. |
| 9,415,418 B2 | 8/2016 | Sreenivasan et al. |
| 9,452,567 B2 | 9/2016 | Syao et al. |
| 9,453,142 B2 | 9/2016 | Rolland et al. |
| 9,486,944 B2 | 11/2016 | El-Siblani et al. |
| 9,492,969 B2 | 11/2016 | Spadaccini et al. |
| 9,498,920 B2 | 11/2016 | Desimone et al. |
| 9,527,244 B2 | 12/2016 | El-Siblani et al. |
| 9,533,450 B2 | 1/2017 | El-Siblani et al. |
| 9,561,623 B2 | 2/2017 | El-Siblani et al. |
| 9,567,439 B1 | 2/2017 | Pyun et al. |
| 9,598,606 B2 | 3/2017 | Rolland et al. |
| 9,676,963 B2 | 6/2017 | Rolland et al. |
| 9,718,096 B2 | 8/2017 | Sreenivasan et al. |
| 9,782,934 B2 | 10/2017 | Willis et al. |
| 9,796,138 B2 | 10/2017 | Liska et al. |
| 9,833,839 B2 | 12/2017 | Gibson et al. |
| 9,975,295 B2 | 5/2018 | Rolland et al. |
| 9,975,296 B2 | 5/2018 | El-Siblani et al. |
| 9,982,164 B2 | 5/2018 | Rolland et al. |
| 9,987,653 B2 | 6/2018 | Sreenivasan et al. |
| 9,987,804 B2 | 6/2018 | El-Siblani et al. |
| 9,993,974 B2 | 6/2018 | Desimone et al. |
| 10,011,076 B2 | 7/2018 | El-Siblani et al. |
| 10,016,938 B2 | 7/2018 | Desimone et al. |
| 10,166,725 B2 | 1/2019 | Willis et al. |
| 10,421,233 B2 | 9/2019 | Lin et al. |
| 2003/0114936 A1 | 6/2003 | Sherwood et al. |
| 2004/0138049 A1 | 7/2004 | Yasrebi et al. |
| 2004/0187714 A1 | 9/2004 | Napadensky et al. |
| 2006/0054039 A1 | 3/2006 | Kritchman et al. |
| 2006/0163774 A1 | 7/2006 | Abels et al. |
| 2006/0257785 A1 | 11/2006 | Johnson |
| 2007/0264481 A1 | 11/2007 | Desimone et al. |
| 2008/0181977 A1 | 7/2008 | Sperry et al. |
| 2008/0252682 A1 | 10/2008 | Hernandez et al. |
| 2009/0196946 A1 | 8/2009 | Kihara et al. |
| 2010/0028994 A1 | 2/2010 | Desimone et al. |
| 2010/0029801 A1 | 2/2010 | Moszner et al. |
| 2010/0125356 A1 | 5/2010 | Shkolnik et al. |
| 2010/0173096 A1 | 7/2010 | Kritchman et al. |
| 2011/0089610 A1 | 4/2011 | El-Siblani et al. |
| 2011/0181941 A1 | 7/2011 | Henningsen |
| 2011/0182805 A1 | 7/2011 | Desimone et al. |
| 2011/0310370 A1 | 12/2011 | Rohner et al. |
| 2011/0318595 A1 | 12/2011 | Breiner et al. |
| 2012/0046376 A1 | 2/2012 | Loccufier et al. |
| 2012/0107625 A1 | 5/2012 | Smith et al. |
| 2012/0195994 A1 | 8/2012 | El-Siblani et al. |
| 2013/0000553 A1 | 1/2013 | Hoechsmann et al. |
| 2013/0001834 A1 | 1/2013 | El-Siblani et al. |
| 2013/0123988 A1 | 5/2013 | Jariwala et al. |
| 2013/0252178 A1 | 9/2013 | Mcleod et al. |
| 2013/0336884 A1 | 12/2013 | Desimone et al. |
| 2014/0084517 A1 | 3/2014 | Sperry et al. |

(56) References Cited

U.S. PATENT DOCUMENTS

| | | |
|---|---|---|
| 2014/0339741 A1 | 11/2014 | Aghababaie et al. |
| 2014/0361463 A1 | 12/2014 | Desimone et al. |
| 2015/0064298 A1 | 3/2015 | Syao et al. |
| 2015/0072293 A1 | 3/2015 | Desimone et al. |
| 2015/0077215 A1 | 3/2015 | Ranky et al. |
| 2015/0097315 A1 | 4/2015 | Desimone et al. |
| 2015/0097316 A1 | 4/2015 | Desimone et al. |
| 2015/0102532 A1 | 4/2015 | Desimone et al. |
| 2015/0202805 A1 | 7/2015 | Saruhashi et al. |
| 2015/0224710 A1 | 8/2015 | El-Siblani et al. |
| 2015/0231828 A1 | 8/2015 | El-Siblani et al. |
| 2015/0231831 A1 | 8/2015 | El-Siblani |
| 2015/0273632 A1 | 10/2015 | Chen |
| 2015/0287169 A1 | 10/2015 | Ueda et al. |
| 2015/0290881 A1 | 10/2015 | Ederer et al. |
| 2015/0328839 A1 | 11/2015 | Willis et al. |
| 2015/0331402 A1 | 11/2015 | Lin et al. |
| 2015/0343745 A1 | 12/2015 | Pesek et al. |
| 2015/0344682 A1 | 12/2015 | Ganapathiappan et al. |
| 2015/0360419 A1 | 12/2015 | Willis et al. |
| 2016/0023403 A1 | 1/2016 | Ramos et al. |
| 2016/0023467 A1 | 1/2016 | Din et al. |
| 2016/0046075 A1 | 2/2016 | Desimone et al. |
| 2016/0059484 A1 | 3/2016 | Desimone et al. |
| 2016/0059486 A1 | 3/2016 | Desimone et al. |
| 2016/0059487 A1 | 3/2016 | Desimone et al. |
| 2016/0067921 A1* | 3/2016 | Willis ............... B29C 64/129 264/401 |
| 2016/0121547 A1 | 5/2016 | Kobayashi et al. |
| 2016/0122539 A1 | 5/2016 | Okamoto et al. |
| 2016/0131974 A1 | 5/2016 | Abe et al. |
| 2016/0136889 A1 | 5/2016 | Rolland et al. |
| 2016/0141535 A1 | 5/2016 | Snaith et al. |
| 2016/0158889 A1 | 6/2016 | Carter et al. |
| 2016/0160077 A1 | 6/2016 | Rolland et al. |
| 2016/0164031 A1 | 6/2016 | Pieper et al. |
| 2016/0167301 A1 | 6/2016 | Cole et al. |
| 2016/0170218 A1* | 6/2016 | Johnson ............... G02B 6/32 359/356 |
| 2016/0193786 A1 | 7/2016 | Moore et al. |
| 2016/0200052 A1 | 7/2016 | Moore et al. |
| 2016/0214321 A1 | 7/2016 | Tow et al. |
| 2016/0271870 A1 | 9/2016 | Brown, Jr. |
| 2016/0271875 A1 | 9/2016 | Brown, Jr. |
| 2016/0303793 A1 | 10/2016 | Ermoshkin et al. |
| 2016/0303795 A1 | 10/2016 | Liu et al. |
| 2016/0325493 A1 | 11/2016 | Desimone et al. |
| 2016/0332386 A1 | 11/2016 | Kuijpers |
| 2016/0368221 A1 | 12/2016 | Ueda et al. |
| 2017/0015058 A1 | 1/2017 | Ueda et al. |
| 2017/0021562 A1 | 1/2017 | El-Siblani et al. |
| 2017/0022312 A1 | 1/2017 | Liu et al. |
| 2017/0080641 A1 | 3/2017 | El-Siblani |
| 2017/0087765 A1 | 3/2017 | Rundlett et al. |
| 2017/0087769 A1 | 3/2017 | Lancaster-Larocque et al. |
| 2017/0106399 A1 | 4/2017 | Sreenivasan et al. |
| 2017/0106603 A1 | 4/2017 | Pobihun |
| 2017/0113406 A1 | 4/2017 | Chen et al. |
| 2017/0113416 A1 | 4/2017 | Desimone et al. |
| 2017/0120326 A1 | 5/2017 | Heikkila et al. |
| 2017/0120515 A1 | 5/2017 | Rolland et al. |
| 2017/0151718 A1 | 6/2017 | Rolland et al. |
| 2017/0173881 A1 | 6/2017 | Dachs, II et al. |
| 2017/0182708 A1 | 6/2017 | Lin et al. |
| 2017/0210077 A1 | 7/2017 | Ermoshkin et al. |
| 2017/0239887 A1 | 8/2017 | Rolland et al. |
| 2017/0246660 A1 | 8/2017 | Thompson et al. |
| 2017/0246804 A1 | 8/2017 | El-Siblani et al. |
| 2017/0291356 A1 | 10/2017 | Adachi et al. |
| 2017/0297099 A1 | 10/2017 | Gibson et al. |
| 2017/0334129 A1 | 11/2017 | Ebert et al. |
| 2017/0342182 A1 | 11/2017 | Pesek et al. |
| 2017/0369633 A1 | 12/2017 | Caruso et al. |
| 2018/0001552 A1 | 1/2018 | Dachs, II et al. |
| 2018/0015669 A1 | 1/2018 | Moore et al. |
| 2018/0044448 A1 | 2/2018 | Moser et al. |
| 2018/0071977 A1 | 3/2018 | Tumbleston et al. |
| 2018/0079865 A1 | 3/2018 | Pyun et al. |
| 2018/0100037 A1 | 4/2018 | Pyun |
| 2018/0105649 A1 | 4/2018 | Pyun et al. |
| 2018/0126630 A1 | 5/2018 | Panzer et al. |
| 2018/0126631 A1 | 5/2018 | Nauka et al. |
| 2018/0133959 A1 | 5/2018 | Moore et al. |
| 2018/0162047 A1 | 6/2018 | Gibson et al. |
| 2018/0162048 A1 | 6/2018 | Gibson et al. |
| 2018/0200948 A1 | 7/2018 | Kuijpers et al. |
| 2018/0208686 A1 | 7/2018 | Pyun et al. |
| 2018/0290374 A1 | 10/2018 | Willis et al. |
| 2019/0224918 A1 | 7/2019 | Zheng |

FOREIGN PATENT DOCUMENTS

| | | |
|---|---|---|
| CN | 102171305 B | 7/2013 |
| CN | 103317140 A | 9/2013 |
| CN | 104609859 A | 5/2015 |
| CN | 104890245 A | 9/2015 |
| CN | 105081325 A | 11/2015 |
| CN | 104725050 B | 1/2017 |
| CN | 205889910 U | 1/2017 |
| CN | 104923781 B | 3/2017 |
| CN | 107573058 A | 1/2018 |
| DE | 3926869 A1 | 2/1991 |
| JP | 2010030322 A | 2/2010 |
| JP | 2017210620 A | 11/2017 |
| JP | 6241944 B2 | 12/2017 |
| KR | 20170005209 A | 1/2017 |
| WO | WO-0140866 A2 | 6/2001 |
| WO | WO-0200569 A2 | 1/2002 |
| WO | WO-2007020634 A2 | 2/2007 |
| WO | WO-2014126830 A2 | 8/2014 |
| WO | WO-2015031227 A1 | 3/2015 |
| WO | WO-2015107066 A1 | 7/2015 |
| WO | WO-2016094827 A1 | 6/2016 |
| WO | WO-2016123499 A1 | 8/2016 |
| WO | WO-2017009368 A1 | 1/2017 |
| WO | WO-2017011533 A1 | 1/2017 |
| WO | WO-2017051084 A1 | 3/2017 |
| WO | WO-2017053783 A1 | 3/2017 |
| WO | WO-2017066546 A1 | 4/2017 |
| WO | WO-2017112483 A2 | 6/2017 |
| WO | WO-2017112682 A1 | 6/2017 |
| WO | WO-2017112751 A1 | 6/2017 |
| WO | WO-2017210298 A1 | 12/2017 |
| WO | WO-2017214007 A1 | 12/2017 |
| WO | WO-2018006018 A1 | 1/2018 |
| WO | WO-2018006029 A1 | 1/2018 |
| WO | WO-2018047479 A1 | 3/2018 |
| WO | WO-2018081053 A1 | 5/2018 |
| WO | WO-2018094131 A1 | 5/2018 |
| WO | WO-2018102341 A1 | 6/2018 |
| WO | WO-2018106472 A1 | 6/2018 |
| WO | WO-2018213356 A1 | 11/2018 |
| WO | WO-2018232175 A1 | 12/2018 |

OTHER PUBLICATIONS

Co-pending U.S. Appl. No. 16/539,333, filed Aug. 13, 2019.
U.S. Appl. No. 16/016,257 Notice of Allowance dated Jul. 17, 2019.
U.S. Appl. No. 16/016,257 Office Action dated Mar. 21, 2019.
U.S. Appl. No. 16/016,262 Notice of Allowance dated Jul. 5, 2019.
U.S. Appl. No. 16/016,262 Office Action dated Mar. 21, 2019.
U.S. Appl. No. 16/276,148 Office Action dated May 20, 2019.
Amine photochemical coinitiators, [online] [Retrieved on Aug. 4, 2014]; Retrieved from the Internet URL: httQ://www.sigmaaldrich.com/materials-science/material-scienceproducts. html?TablePage=20204246; 2 pages.
"Anilox." Wikipedia, Wikimedia Foundation, May 16, 2018, en.wikipedia.org/wiki/Anilox.
Benoit, et al. Development of a universal alkoxyamine for 'living' free radical polymerizations. J. Am. Chern. Soc., 121 (1999): 3904-3920.

(56) References Cited

OTHER PUBLICATIONS

Berg, et al. A dual-cure, solid-state photoresist combining a thermoreversible Diels-Alder network and a chain growth acrylate network. Macromolecules, 47.10 (2014): 3473-3482.

"Capabilities." Technical Coatings International Capabilities, Mar. 14, 2017, http://www.tciinc.com/capabilities/.

Chen, et al. Novel multifunctional hyperbranched polymeric photoinitiators with built-in amine coinitiators for UV curing. J. Mater. Chem., 17 (2007): 3389-3392.

Coenen. Industry trends are boosting Jet Printing. 2015.

Co-pending U.S. Appl. No. 16/016,253, filed Jun. 22, 2018.

Co-pending U.S. Appl. No. 16/016,257, filed Jun. 22, 2018.

Co-pending U.S. Appl. No. 16/016,262, filed Jun. 22, 2018.

Co-pending U.S. Appl. No. 16/049,288, filed Jul. 30, 2018.

Corrales, et al. Free radical macrophotoinitiators: an overview on recent advances. Journal of Photochemistry and Photobiology A: Chemistry, 159 (2003): 103-114.

Deckers, et al. Additive Manufacturing of Ceramics: A Review, J. Ceram. Sci. Tech., 05 [04] 245-260 (2014).

Dendukuri, et al. Continuous-Flow Lithography For High-Throughput Microparticle Synthesis. Nature Materials, 5 (May 2006): 365-369.

Essemtec AG. Essemtec—Spider—Compact High Speed Jetter and Dispenser. YouTube Web Video. Published on Jul. 5, 2016. 2 pages. URL<https://www.youtube.com/watch?v=NpgBurid2wU.

Essemtec AG. Essemtec Scorpion—Versatile High Speed Jetting of Solder Paste and Glue. YouTube Web Video. Published on Nov. 13, 2014. 2 pages. URL<https://www.youtube.com/watch?v=SZ-Kq2Gkm5Y.

Fairbanks, et al. Photoinitiated polymerization ofPEG-diacrylate with lithium phenyl-2,4,6-trimethylbenzoylphosphinate: polymerization rate and cytocompatibility. Biomaterials, 30 (2009): 6702-6707.

"Flexography." Wikipedia, Wikimedia Foundation, May 23, 2018, en.wikipedia.org/wiki/Flexography.

German, et al. Injection Molding of Metals and Ceramics. Metal Powder Industries Federation, 1997.

Gonsalvi, et al. Novel synthetic pathways for bis(acyl)phosphine oxide photoinitiators. Angew. Chem. Int. Ed., 51 (2012): 7895-7897.

Green, Industrial photoinitiators—a technical guide, CRC Press,© 2010 Taylor and Francis Group, LLC, 191 pages.

Houben. Equipment for printing of high viscosity liquids and molten metals. Universiteit Twente. Sep. 27, 2012.

Ikemura, et al. Design of a new dental adhesive—effect of a water-soluble sodium acyl phosphine oxide with crown ether on adhesion to dental hard tissues. Dental Materials Journal, 28.3 (2009): 267-276.

Kloxin, et al. Photodegradable hydro gels for dynamic tuning of physical and chemical properties. Science, 324 (2009): 59-63.

Kyzen. Stencil Cleaning & Misprinted PCB Cleaners. 2018. http://www.kyzen.com/electronics-manufacturing-cleaning/stencils-and-misprints/.

Lambert, et al. Design considerations for mask projection microstereolithography systems. (Jun. 22, 2016) [online] (retrieved from https://sffsymposium.engr.utexas.edu/Manuscripts/2013/2013-09-Lambert.pdf), 20 pages.

Lee, et al. Solvent Compatibility of Poly(dimethylsiloxane)-Based Microfluidic Devices, Anal. Chem. 75 (2003): 6544-6554.

Massey, L. Permeability Properties of Plastics and Elastomers—A Guide to Packaging and Barrier Materials. Published Jan. 1, 2003. pp. 1-5, 19-29.

Matyjaszewski, et al. Atom transfer radical polymerization. Chem. Rev., 101 (2001): 2921-2990.

Mcdonald, et al. Fabrication ofmicrofluidic systems in poly(dimethylsiloxane). Electrophoresis, 21(2000): 27-40.

Miller. Slot Die Coating Technology. Aug. 3, 2009.

Moad, et al. Living radical polymerization by the RAFT process. Aust. J. Chem., 58 (2005): 379-410.

Murata, et al. Photopolymerization-induced phase separation in binary blends of photocurable/linear polymers. Polymer. vol. 43, Issue 9, Apr. 2002, pp. 2845-2859.

Myiconnect007. Taiyo's Inkjet Solder Mask Applied with Meyer Burger's PIXDRO IP410 Printer. YouTube Web Video. Published on Feb 13, 2015. 2 pages. URL<https://www.youtube.com/watch?v=jm_JteEkQWE.

Organic photoinitiators, [online] [Retrieved on Aug. 4, 2014]; Retrieved from the Internet URL: httQ://www.sigmaaldrich.com/materials-science/material-scienceproducts.html?TablePage=16374997; 1 page.

Otsu, et al. Polymer design by iniferter technique in radical polymerization: synthesis of AB and ABA block copolymers containing random and alternating copolymer se_guences. Polymer Journal, 17.1 (1985): 97-104.

Pan, et al. Rapid manufacturing in minutes: the development of a mask projection stereolithography process for high-speed fabrication. Proceedings of the ASME 2012 International Manufacturing Science and Engineering Conferences, Jun. 4-8, 2012, Notre Dame, Indiana, US, 10 pages.

Pinnau, et al. Gas and vapor properties of amorphous perfluorinated copolymer membranes based on 2,2-bistrifluoromethyl-4,5-difluoro-1,3-dioxole/tetrafluoroethylene. Journal of Membrane Science, 109: 125-133 (1996).

RAFT agents, [online] [Retrieved on Aug. 4, 2014]; Retrieved from the Internet URL: h!!Q ://www. sigmaaldrich.com/materials-science/material-sc ienceproducts. htrnl?TablePage=I03936134; 4 pages.

"Reverse Roll Coating." Wikipedia, Wikimedia Foundation, Apr. 10, 2018, en.wikipedia.org/wiki/Reverse_roll_coating.

Scott, et al. Two-color single-photon photoinitiation and photoinhibition for subdiffraction photolithography. Science, 324 (2009): 913-917.

"Screen Printing." Wikipedia, Wikimedia Foundation, May 17, 2018, en.wikipedia.org/wiki/Screen_printing#1960s_to_present.

"Spin Coating." Wikipedia, Wikimedia Foundation, Apr. 10, 2018, en.wikipedia.org/wiki/Spin_coating.

Szczepanski, et al. A new approach to network heterogeneity: Polymerization Induced Phase Separation in photo-initiated, free-radical methacrylic systems. Polymer (Guildf). Sep. 28, 2012;53(21):4694-4701.

Temel, et al. Synthesis of main chain polymeric benzophenone photoinitiator via thiol-ene click chemistry and its use in free radical polymerization. J. Polym. Sci. A: Polym. Chem., 48 (2010): 5306-5312.

Unknown author, "DuPont™ Teflon® AF amorphous fluoroplastic resin," (Jun. 22, 2016) [online] (retrieved from http://www2.dupont.com/Teflon_Industrial/en_US/assets/downloads/h44587.pdf), 4 pages.

Unknown author, "Teflon™ AF amorphous fluoroplastic resins," (Jun. 22, 2016) [online] (retrieved from https://www.chemours.com/Teflon_Industrial/en_us/assets/downloads/teflon-af-product-information.pdf), 3 pages.

U.S. Appl. No. 14/711,703 Notice of Allowance dated Jun. 8, 2017.

U.S. Appl. No. 14/711,703 Office Action dated Apr. 22, 2016.

U.S. Appl. No. 14/711,703 Office Action dated Dec. 1, 2016.

U.S. Appl. No. 14/848,162 Office Action dated Jun. 5, 2018.

U.S. Appl. No. 14/848,162 Office Action dated Sep. 18, 2017.

U.S. Appl. No. 14/967,055 Office Action dated May 19, 2017.

U.S. Appl. No. 14/967,055 Office Action dated Jul. 12, 2018.

U.S. Appl. No. 14/967,055 Office Action dated Nov. 1, 2017.

Wei, et al. A highly efficient polyurethane-type polymeric photoinitiator containing in-chain benzophenone and coinitiator amine for photopolymerization of PU prepolymers. Macromol. Chem. Phys., 207 (2006): 2321-2328.

Yang, et al. Synthesis of 1,6-hexanediol diacrylate, 2010.

Yang, H. et al. "High Viscosity Jetting System for 3d Reactive Inkjet Printing." (2013).

Zhang, Teflon AF composite materials in membrane separation and molecular recognition in fluorous media. Ph.D. dissertation, University of Pittsburgh, 2013, 207 pages.

U.S. Appl. No. 14/967,055 Office Action dated Jan. 7, 2019.

U.S. Appl. No. 15/374,734 Office Action dated Sep. 6, 2019.

PCT/US2018/032837 International Search Report and Written Opinion dated Sep. 24, 2018.

(56) References Cited

OTHER PUBLICATIONS

PCT/US2018/037630 International Search Report and Written Opinion dated Oct. 3, 2018.
U.S. Appl. No. 14/848,162 Notice of Allowance dated Oct. 3, 2018.
U.S. Appl. No. 16/016,257 Office Action dated Sep. 27, 2018.
U.S. Appl. No. 16/016,262 Office Action dated Sep. 28, 2018.
U.S. Appl. No. 16/049,288 Office Action dated Oct. 11, 2018.
Co-pending U.S. Appl. No. 16/202,039, filed Nov. 27, 2018.
Co-pending U.S. Appl. No. 16/276,148, filed Feb. 14, 2019.
U.S. Appl. No. 15/983,962 Notice of Allowance dated Oct. 12, 2018.
U.S. Appl. No. 16/016,253 Office Action dated Feb. 21, 2019.
U.S. Appl. No. 16/016,253 Office Action dated Oct. 16, 2018.
U.S. Appl. No. 16/049,288 Notice of Allowance dated Jan. 3, 2019.
Varma et al. Solution Combustion Synthesis of Nanoscale Materials. Chem Rev. Dec. 14, 2016;116(23):14493-14586.

* cited by examiner

FIG. 3A
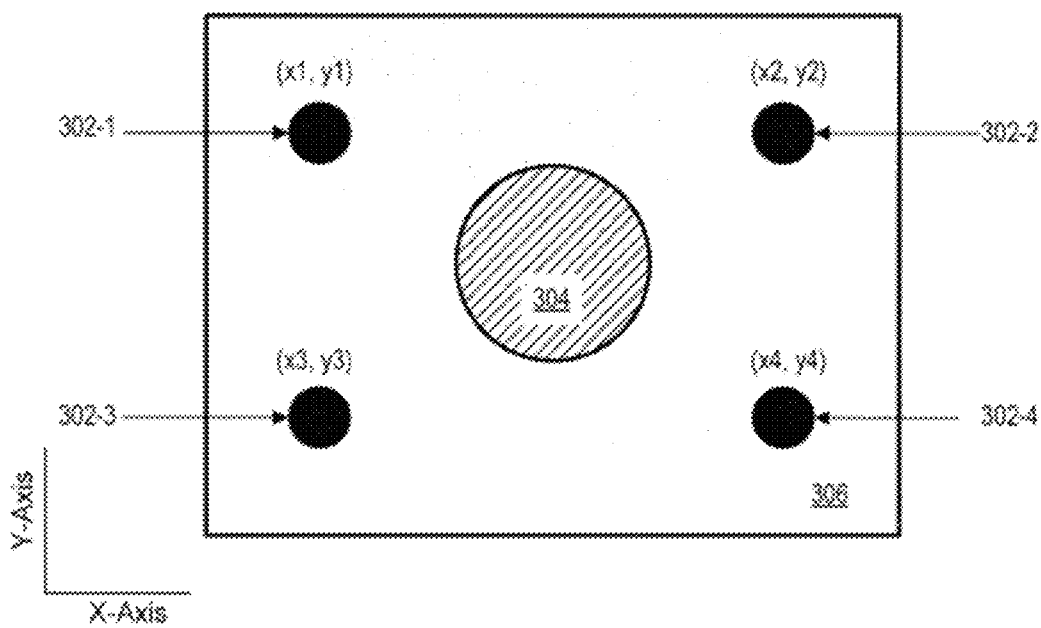
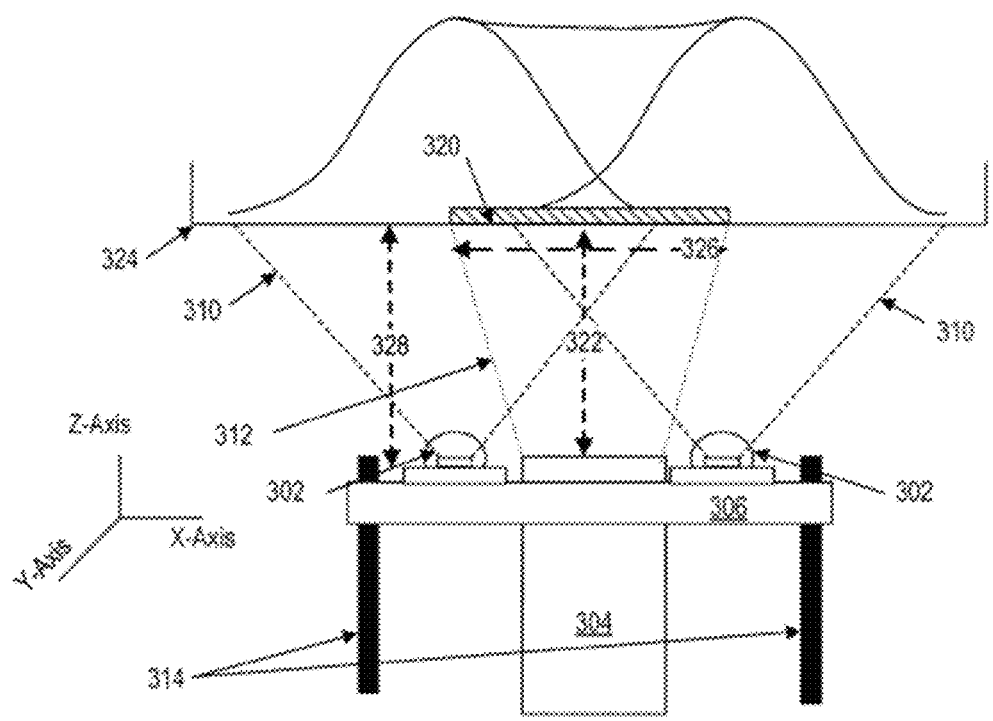
FIG. 3B

MULTI WAVELENGTH STEREOLITHOGRAPHY HARDWARE CONFIGURATIONS

CROSS-REFERENCE

This application claims priority to U.S. Provisional Patent Application No. 62/470,813, filed Mar. 13, 2017, which is entirely incorporated herein by reference.

BACKGROUND

Photopolymer-based 3D printers that use bottom-up illumination can project light upwards through an optically transparent window into a reservoir of photoactive resin to cure at least a portion of the resin. Such printers can build a 3D printed structure by forming one layer at a time, where a subsequent layer adheres to the previous layer.

SUMMARY

The present disclosure provides methods and systems relating to hardware configurations for performing multi-wavelength three dimensional (3D) printing using photoinhibition, such as by creating a photoinhibition layer using light sources having a particular wavelength and configured with respect to a build area to produce a photoinhibition process by photo-chemically generating a species that inhibits the polymerization. The present disclosure describes a projection light device used to produce photoinitiation using a first wavelength, and light sources used for producing the photoinhibition using a second, different wavelength. The light sources for producing inhibition can be on-axis flood lights, and techniques are described for configuring the light sources to produce a uniform intensity of a photoinhibiting light in the build area.

In general, one or more aspects of the subject matter described in the present disclosure can be embodied in one or more systems that include: a reservoir capable of holding a liquid including a photoactive resin, a build head that moves within the reservoir during three dimensional (3D) printing of a 3D printed structure on the build head, a light projection device arranged with respect to the reservoir that projects a first light into a build area within the liquid in the reservoir, where the build area is defined in part by a throw ratio of the light projection device, and where the first light has a first wavelength that produces photoinitiation of curing of the photoactive resin to form the 3D printed structure on the build head, and light sources arranged with respect to the reservoir that project a second, photoinhibiting light into the build area at a second wavelength, the light sources arranged with respect to the light projection device such that a peak intensity of each of the light sources at the second wavelength is directed at a different respective position (e.g., corner) of the build area. Other implementations can include corresponding methods, apparatus, and computer program products.

These and other implementations can include one or more of the following features. In some implementations, the first light of the system is a patterned light and the second light of the system is a flood light. The light sources producing the second light can be light emitting diodes (LEDs). In some implementations, the system includes a controller that varies power input to the one or more light sources and can adjust an intensity of the one or more light sources.

In some implementations, the system further includes a platform that is adjustable along at least an axis perpendicular to the build area. In some implementations, the platform is adjustable on the axis perpendicular to the build area such that the platform is set to an optimized distance from the build area, where the optimized distance is determined in part by an area of the build area and a location of the photoinhibition layer.

In some implementations, the light sources can be arranged on the platform such that the light sources project a uniform intensity of the second light into the build area. Additionally, the platform can be a heat sink to mitigate excess heat produced by at least the light sources arranged on the platform.

The build area can additionally be defined by one or more projection optics and a projected image resolution achievable using the first wavelength of the first light with the one or more projection optics.

In addition, one or more aspects of the subject matter described in the present disclosure can be embodied in one or more computer-storage media storing instructions that when executed by one or more data processing apparatus cause the one or more data processing apparatus to perform operations in one or more methods that include moving a build head within a reservoir holding a liquid including a photoactive resin during 3D printing of a 3D printed structure on the build head, creating a 3D printed structure on the build head from the photoactive resin within a photoinitiation layer by projecting a first light having a first wavelength from a light projection device into a build area within the liquid in the reservoir, the build area defined in part by a throw ratio and the first wavelength selected to produce photoinitiation of the curing of the photoactive resin, and creating a photoinhibition layer in the build area within the liquid of the reservoir by directing light sources arranged with respect to the reservoir and projecting a second light having a second wavelength, the second light selected to produce photoinhibition of curing of the photoactive resin within a photoinhibition layer for the build area and where the light sources are arranged with respect to the light projection device such that a peak intensity of each of the light sources at the second wavelength is directed at a different respective position (e.g., corner or other position) of the build area. For example, the build area may have four corners and a separate beam of light may be directed to each corner of the build area. The beams of light may overlap to provide a uniform projection across the build area.

In some implementations, creating the 3D printed structure on the build head includes iteratively projecting the first light into the build area and raising the build head, and changing a thickness of the photoinhibition layer, in part, by adjusting the intensity of the second light. Adjusting the intensity of the second light can include varying power input to one or more light sources projecting the second light, which can adjust the intensity of the one or more light sources.

In some implementations, achieving uniform intensity of the second light includes moving the platform with light sources projecting the second light along a perpendicular axis with respect to the build area and measuring an intensity distribution of the light sources around the build area.

In some implementations, creating a 3D printed structure on the build head from the liquid includes a liquid composition having one or more photoinhibitor species and one or more photoinitiator species. Additionally, the intensity of one or more of the light sources can be adjusted based in part on an amount of the one or more photoinhibitor species in the liquid and/or the type of the one or more photoinhibitor species in the liquid.

A method of controlling the inhibition zone of a photopolymer based additive manufacturing device, by use of a second wavelength has been described in U.S. Patent Publication No. 2016-0067921. The addition of a second wavelength is challenging in practice, in arranging both sources to allow for coincident, uniform, and controllable illumination.

Particular embodiments of the subject matter described in the present disclosure can be implemented to realize one or more of the following advantages. Utilizing on-axis light emitting diodes to produce the inhibition layer can reduce cost and complexity of operation significantly over other approaches that include complicated off-axis optics to produce a photoinhibition layer. For example, using on-axis planar light emitting diodes can remove the need for specialized lensing (e.g., projection lenses), expensive dichroic mirrors, and/or off-axis mounting apparatuses, lowering power requirements for the light sources, and avoiding other complex excess heat-mitigation techniques.

Additionally, a uniform intensity over a rectangular build area can be achieved by using as few as four light emitting diodes arranged in a planar configuration. Uniform intensity from several light emitting diodes can overcome challenges associated with using a single light source (e.g., a single light emitting device) such as poor uniformity of inhibiting light density in a photoinhibition layer.

The planar configuration can also include a platform for mounting the light emitting diodes (LEDs), the platform also acting as a heat sink to mitigate excess heat from the LEDs. Moreover, the uniform intensity in the build area can be achieved with a simple adjustment of the platform along an axis perpendicular to the build area, rather than relying on several degrees of freedom for optimization.

Light sources in the ultraviolet (UV), in particular, can suffer from a number of issues including short lifetime (e.g., <2000 hours rated hours of operation), relatively long stabilization periods during warm up, high cost, and non-uniform intensity over the source lifetime (e.g., mercury vapor lamps). Additionally, mercury vapor lamps require expensive and oftentimes delicate optics (e.g., parabolic mirror) to improve intensity uniformity. In contrast, light emitting diodes (LEDs) have longer lifetimes, reliable power output over their lifetimes, shorter warm-up periods, higher beam profile uniformity, and lower power requirements. A variety of LED packages at various wavelengths may be used (e.g., LED Engin Ultraviolet 365 nm LEDs).

LEDs further benefit from having a range of light emission intensities easily achievable by varying a power input to the LED using a controller. This can reduce a need for additional filters (e.g., neutral density filters) to reduce the intensity of photoinhibiting light in the build area. An adjustable intensity can result in an adjustable thickness photoinhibition layer during the 3D printing process, and thereby result in an adjustable layer thickness of the 3D printed structure.

In addition to allowing for an adjustable layer thickness of the 3D printed structure, producing a photoinhibition layer with adjustable thickness within the build area in the liquid can also grant additional control to reduce adhesion at the resin-window interface in a photopolymer-based 3D printer. The additional control to reduce adhesion through an adjustable photoinhibition layer thickness can thereby reduce or eliminate the undesirable force that may otherwise be needed to separate the window and polymer. This can result in a reduced failure rate and improved 3D prints. Moreover, the region of inhibited polymerization can be made significantly larger than that generated using a polydimethylsiloxane (PDMS) window. Thus, the forces in the normal direction, which are produced by Stefan adhesion during separation of the 3D printed structure and a traditional PDMS window, can be avoided.

Unlike a conventional PDMS printer, a sliding or rotational mechanism need not be used to separate the cured polymer and window, which can reduce the complexity and cost of the 3D printer, and/or increase the build area of the 3D printer relative to the physical size of the 3D printer. However, in some implementations, a sliding or rotational mechanism can be used. Moreover, increased print speeds can be achieved, and print accuracy can be increased due to fewer mechanical forces being applied to the print. Thus, increased reliability can be achieved in both the print and the print mechanism by eliminating mechanical points of failure (e.g., over-adhesion).

Moreover, by not being restricted to a PDMS window, the choice of window materials expands to include standard optical window materials, such as PMMA (poly-methyl methacrylate) or glass, which may not usually be possible due to strong adhesion. This introduces further potential for material and manufacturing cost savings. In addition, as the resin does not swell into glass and hard plastic substances, more latitude is imparted to photopolymer formulation. This is in contrast with PDMS, where the photopolymer resins can swell into the PDMS, polymerize, and phase separate, thereby causing the PDMS to become hazy, which significantly diminishes light transmission through the PDMS, and increases undesirable light scattering, de-focusing the projector pattern.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

FIGS. 3A-3C show an example of an implementation with four light sources for generating a photoinhibition layer;

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

The present disclosure provides methods and systems for multi-wavelength three-dimensional (3D) printing. Methods and systems of the present disclosure may employ at least 2, 3, 4, 5, 6, 7, 8, 9, 10, or more different wavelengths of light to print a 3D object.

Figure 1:
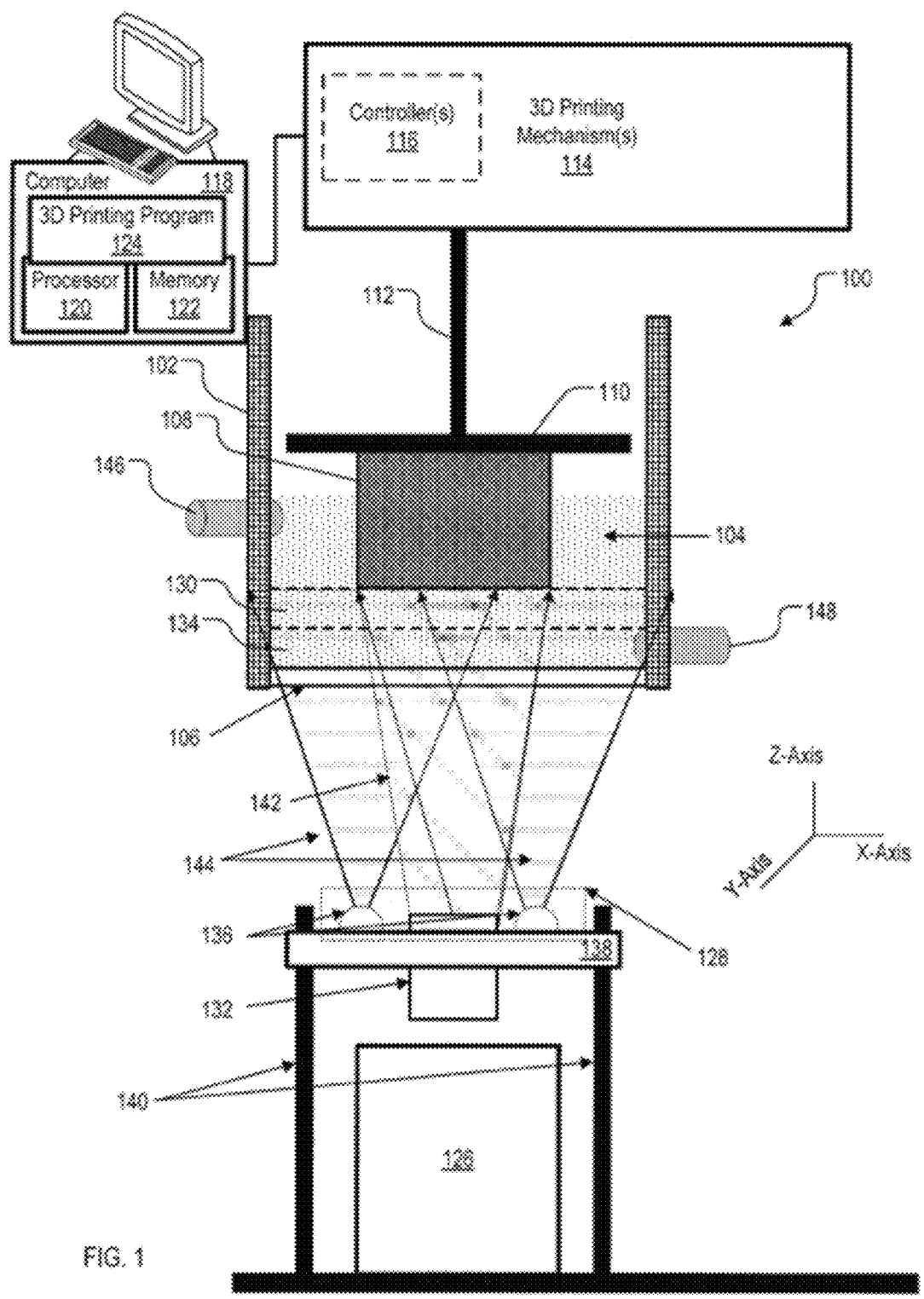
FIG. 1 shows an example of a 3D printing system.

FIG. 1 shows an example of a 3D printing system 100. The system 100 includes a reservoir 102 to hold a liquid 104, which includes one or more photoactive resins. The reservoir 102 includes a window 106 in its bottom through which illumination is transmitted to cure a 3D printed structure 108. The 3D printed structure 108 is shown in FIG. 1 as a block, however, in practice a wide variety of complicated shapes can be 3D printed. In some implementations, the 3D printed structure 108 includes entirely solid structures, hollow core prints, lattice core prints and generative design geometries. Additionally, a 3D printed structure 108 can be partially cured such that the 3D printed structure 108 has a gel-like or viscous liquid characteristic.

The 3D printed structure 108 is 3D printed on a build head 110, which is connected by a rod 112 to one or more 3D printing mechanisms 114. The 3D printing mechanisms 114 can include various mechanical structures for moving the build head 110 within and above the reservoir 102. This movement is a relative movement, and thus moving pieces can be the build head 110, the reservoir 102, or both, in various implementations. In some implementations, the 3D printing mechanisms 114 include Cartesian (xyz) type 3D printer motion systems or delta type 3D printer motion systems. In some implementations, the 3D printing mechanisms 114 include one or more controllers 116 which can be implemented using integrated circuit technology, such as an integrated circuit board with embedded processors and firmware. Such controllers 116 can be in communication with a computer or computer systems 118. In some implementations, the 3D printing system 100 includes a computer 118 that connects to the 3D printing mechanisms 114 and operates as a controller for the 3D printing system 100.

A computer 118 can include one or more hardware (or computer) processors 120 and a memory 122. For example, a 3D printing program 124 can be stored in the memory 122 and run on the one or more processors 120 to implement the techniques described herein. The controller 118, including the one or more hardware processors 120, may be individually or collectively programmed to implement methods of the present disclosure.

Multiple devices emitting various wavelengths and/or intensities of light, including a light projection device 126 and light sources 128, can be positioned below the window 106 and in communication to the computer 118 (or other controller). In some implementations, the multiple devices include the light projection device 126 and the light sources 128. The light sources 128 can include 2, 3, 4, 5, 6, or more light sources. As an alternative to the light sources 128, a single light source may be used. The light projection device 126 directs a first light having a first wavelength into the liquid 104 within the reservoir 102 through window 106. The first wavelength emitted by the light projection device 126 is selected to produce photoinitiation and is used to create the 3D printed structure 108 on the build head 110 by curing the photoactive resin in the liquid 104 within a photoinitiation layer 130. In some implementations, the light projection device 126 is utilized in combination with one or more projection optics 132 (e.g. a projection lens for a digital light processing (DLP) device), such that the light output from the light projection device 126 passes through one or more projection optics 132 prior to illuminating the liquid 104 within the reservoir 102.

In some implementations, the light projection device 126 is a DLP device including a digital micro-mirror device (DMD) for producing patterned light that can selectively illuminate and cure 3D printed structures 108. The light projection device 126, in communication with the computer 118, can receive instructions from the 3D printing program 124 defining a pattern of illumination to be projected from the light projection device 126 into the photoinitiation layer 130 to cure a layer of the photoactive resin onto the 3D printed structure 108.

In some implementations, the light projection device 126 and projection optics 132 are a laser and a scanning mirror system, respectively (e.g., stereolithography apparatus). Additionally, in some implementations, the light source includes a second laser and a second scanning mirror system. Such light source may emit a beam of a second light having a second wavelength. The second wavelength may be different from the first wavelength. This may permit photoinhibition to be separately controlled from photoinitiation. Additionally, in some implementations, the platform 138 is separately supported on adjustable axis rails 140 from the projection optics 132 such that the platform 138 and the projection optics 132 can be moved independently.

The relative position (e.g., vertical position) of the platform 138 and the reservoir 102 may be adjusted. In some examples, the platform 138 is moved and the reservoir 102 is kept stationary. As an alternative, the platform 138 is kept stationary and the reservoir 102 is moved. As another alternative, both the platform 138 and the reservoir 102 are moved.

The light sources 128 direct a second light having a second wavelength into the liquid 104 in the reservoir 102. The second light may be provided as multiple beams from the light sources 128 into the build area simultaneously. As an alternative, the second light may be generated from the light sources 128 and provided as a single beam (e.g., uniform beam) into the beam area. The second wavelength emitted by the light sources 128 is selected to produce photoinhibition in the photoactive resin in the liquid 104 and is used to create a photoinhibition layer 134 within the liquid 104 directly adjacent to the window 106. The light sources 128 can produce a flood light to create the photoinhibition layer 134, the flood light being a non-patterned, high-intensity light. In some implementations, the light sources 128 are light emitting diodes (LEDs) 136. The light sources 128 can be arranged on a platform 138. The platform 138 is mounted on adjustable axis rails 140. The adjustable axis rails 140 allow for movement of the platform 138 along an axis. Further details about the arrangement of the light sources 128 on the platform 138 and the positioning of the platform in the 3D printing system 100 will be described in more detail with reference to FIGS. 3A-3C. In some implementations, the platform 138 additionally acts as a heat-sink for at least the light sources 128 arranged on the platform 138.

For each of the light projection device 126 and the light sources 128, there is a beam path for light emitted from the respective light source under normal operating conditions (e.g., device is "on"). For example, a depiction of a beam path for light projection device 126 is shown in FIG. 1 as a projection beam path 142. Beam paths 144 are a depiction of exemplary beam paths for two LEDs 136. Although beam paths 142 and 144 are depicted in FIG. 1 as two-dimensional, a beam path can be three-dimensional with a cross-section that can be circular, elliptical, rectangular, or the like. In some implementations, the photoinitiation wavelength is approximately 460 nm, and the photoinhibition wavelength is approximately 365 nm.

The respective thicknesses of the photoinitiation layer 130 and the photoinhibition layer 134 can be adjusted by computer 118 (or other controller). In some implementations, this change in layer thickness(es) is performed for each new 3D printed layer, depending on the desired thickness of the 3D printed layer, and/or the type of 3D printing process being performed. The thickness(es) of the photoinitiation layer 130 and the photoinhibition layer 134 can be changed, for example, by changing the intensity of the respective light emitting devices, exposure times for the respective light emitting devices, the photoactive species in the liquid 104, or a combination thereof. In some implementations, by controlling relative rates of reactions between the photoactive species (e.g., by changing relative or absolute amounts of photoactive species in the liquid, or by adjusting light intensities of the first and/or second wavelength), the overall rate of polymerization can be controlled. This process can thus be used to prevent polymerization from occurring at the resin-window interface and control the rate at which polymerization takes place in the direction normal to the resin-window interface.

For example, in some implementations, an intensity of the light sources 128 emitting a photoinhibiting wavelength to create a photoinhibition layer 134 is altered in order to change a thickness of the photoinhibition layer 134. Altering the intensity of the light sources 128 can include increasing the intensity or decreasing the intensity of the light sources 128. Increasing the intensity of the light sources 128 (e.g., LEDs) can be achieved by increasing a power input to the light sources 128 by controllers 116 and/or computer 118. Decreasing the intensity of the light sources 128 (e.g., LEDs) can be achieved by decreasing a power input to the light sources 128 by controllers 116 and/or computer 118. In some implementations, increasing the intensity of the light sources 128, and thereby increasing the thickness of the photoinhibition layer 134, will result in a decrease in thickness of the photoinitiation layer 130. A decreased photoinitiation layer thickness can result in a thinner 3D printed layer on the 3D printed structure 108.

In some implementations, the intensities of all of the light sources 128 are altered equally (e.g., decreased by a same level by reducing power input to all the light sources by an equal amount). The intensities of the light sources 128 can also be altered where each light source of a set of light sources 128 produces a different intensity. For example, for a set of four LEDs generating a photoinhibition layer 134, two of the four LEDs can be decreased in intensity by 10% (by reducing power input to the LEDs) while the other two of the four LEDs can be increased in intensity by 10% (by increasing power input to the LEDs). Setting different intensities for a set of light sources 128 can produce a gradient of thickness in a cured layer of the 3D printed structure or other desirable effects.

In some implementations, the computer 118 (in combination with controllers 116) adjusts an amount of a photoinitiator species and/or a photoinhibitor species in the liquid 104. The photoinitiator and photoinhibitor species can be delivered to the reservoir 102 via an inlet 146 and evacuated from the reservoir 102 via an outlet 148. In general, one aspect of the photoinhibitor species is to prevent curing (e.g., suppress cross-linking of the polymers) of the photoactive resin in the liquid 104. In general, one aspect of the photoinitiation species is to promote curing (e.g., enhance cross-linking of the polymers) of the photoactive resin in the liquid 104. In some implementations, the 3D printing system 100 includes multiple containment units to hold input/output flow from the reservoir 102.

In some implementations, the intensities of the light sources 128 are altered based in part on an amount (e.g., volumetric or weight fraction) of the one or more photoinhibitor species in the liquid and/or an amount (e.g., volumetric or weight fraction) of the one or more photoinitiator species in the liquid. Additionally, the intensities of the light sources 128 are altered based in part on a type (e.g., a particular reactive chemistry, brand, composition) of the one or more photoinhibitor species in the liquid and/or a type (e.g., a particular reactive chemistry, brand, composition) of the one or more photoinitiator species in the liquid. For example, an intensity of the light sources 128 for a liquid 104 including a first photoinhibitor species of a high sensitivity (e.g., a high reactivity or conversion ratio to a wavelength of the light sources 128) can be reduced when compared to the intensity of the light sources 128 for a liquid 104 including a second photoinhibitor species of a low sensitivity (e.g., a low reactivity or conversion ratio to a wavelength of the light sources 128).

In some implementations, the changes to layer thickness(es) is performed during the creation of the 3D printed structure 108 based on one or more details of the 3D printed structure 108 at one or more points in the 3D printing process. For example, the respective layer thickness(es) can be adjusted to improve resolution of the 3D printed structure 108 in the dimension that is the direction of the movement of the build head 110 relative to the reservoir 102 (e.g., z-axis) in the layers that require it.

Though the 3D printing system 100 was described in FIG. 1 as a bottom-up system where the light projection device 126 and the light sources 128 are located below the reservoir 102 and build head 110, other configurations can be utilized. For example, a top-down system, where the light projection device 126 and the light sources 128 are located above the reservoir 102 and build head 110, can also be employed.

Figure 2A:
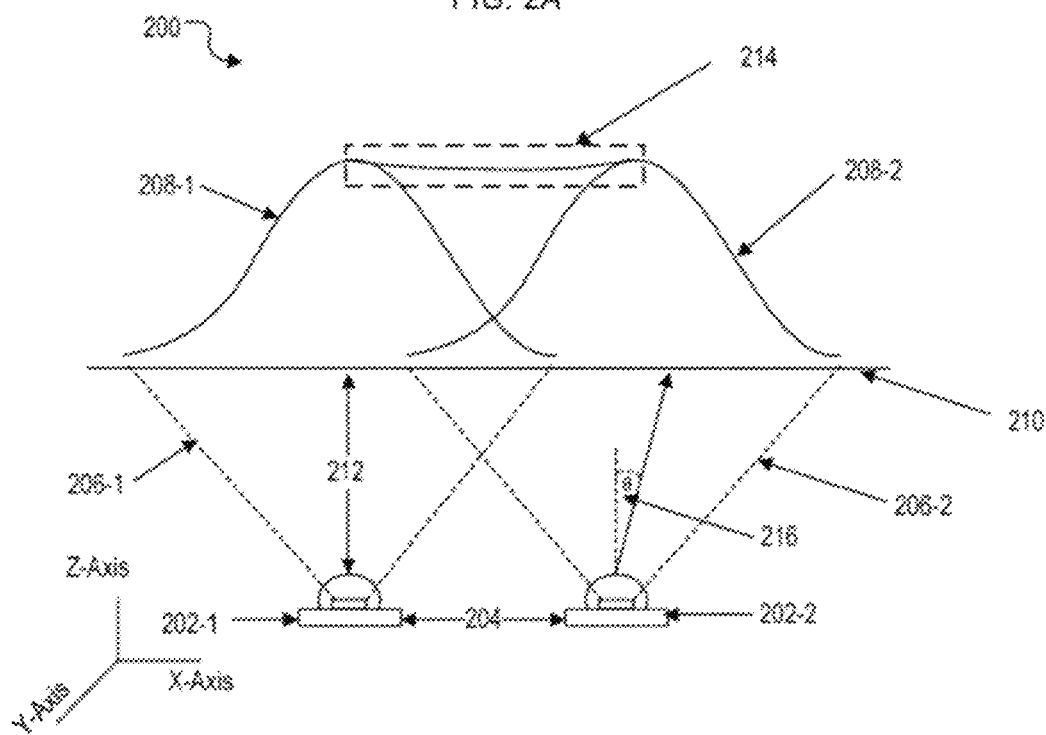
FIGS. 2A and 2B show examples of diagrams of light sources with overlapping beam paths.

FIG. 2A depicts a diagram 200 where light emitting diodes (LEDs) 202-1 and 202-2 are positioned at a separation distance 204 such that the respective optical beams 206-1 and 206-2 (with Lambertian intensity distributions 208-1 and 208-2, respectively) overlap at a plane 210 that is a projection distance 212 from the LEDs. At the LED projection distance 212, the overlapping optical beams 206-1 and 206-2 combine to achieve a combined intensity distribution 214 at the plane 210. Though depicted in FIG. 2A in one dimension along an x-axis, the plane 210 can be imagined to extend into a second, y-axis as a xy plane.

Figure 2B:
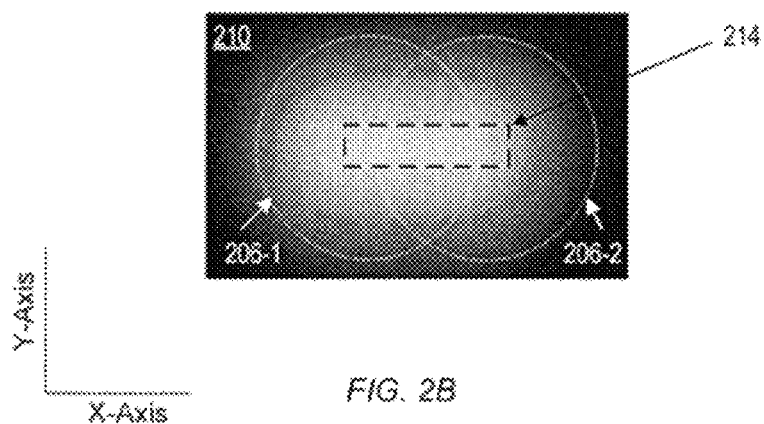

The combined intensity distributions 214 of LEDs 202-1 and 202-2 at plane 210 are depicted in FIG. 2B. LED light sources demonstrate a Lambertian distribution, with a peak intensity in the center, rolling off with attenuation at the fringes. In some implementations, a separation distance 204 between the LEDs 202-1 and 202-2 are determined in part using an intensity distribution for each respective LED 202-1 and 202-2 at the plane 210. The intensity distribution for an LED light source can be estimated using a normal distribution equation:

$$I_X = \frac{1}{\sigma\sqrt{2\pi}} \exp\left[\frac{(x_0 - x_1)^2}{2\sigma^2}\right]$$

Where $I_x$ is the intensity distribution along an axis as defined by Cartesian coordinates
σ is standard deviation
$\sigma^2$ is variance
x is distance from a center point (peak intensity) of the LED Combining the above equation with an approximate value of the standard deviation σ being $$\sigma \approx \frac{FWHM}{2.355}$$

for an LED, where FWHM is the full width half maximum for the LED at which 50% of the peak intensity of the LED is reached for the Lambertian distribution of the peak intensity, and assuming that an LED demonstrates circular symmetry in its beam output, the irradiance can be calculated using a two dimensional Gaussian relationship.

$$I_{xy} = \int\int_{-\infty}^{\infty} f(x, y)dxdy = 2\pi A \sigma_x \sigma_y$$

Where $I_{xy}$ is the intensity distribution at a plane xy as defined by Cartesian coordinates and
$\sigma_x = \sigma_y$
A=1

By solving for the irradiance of the LEDs 202-1 and 202-2 at a plane 210 as a function of angle θ 216 and projection 212 over an area of interest, the distribution and total irradiance of the inhibition wavelength emitted by a light source within the area of interest can be determined. Knowing the irradiance of each of the LED light sources 202-1 and 202-2, the separation distance 204 and LED projection length 212 can each be selected such that uniform intensity is achieved for the region defined by the combined intensity distribution 214. In some implementations, the separation distance 204 and the LED projection length 212 are selected during a time of system design. In some implementations, the separation distance 204 and the LED projection length 212 can be selected during operation of the 3D printing system (e.g., 3D printing system 100).

Figure 3C:
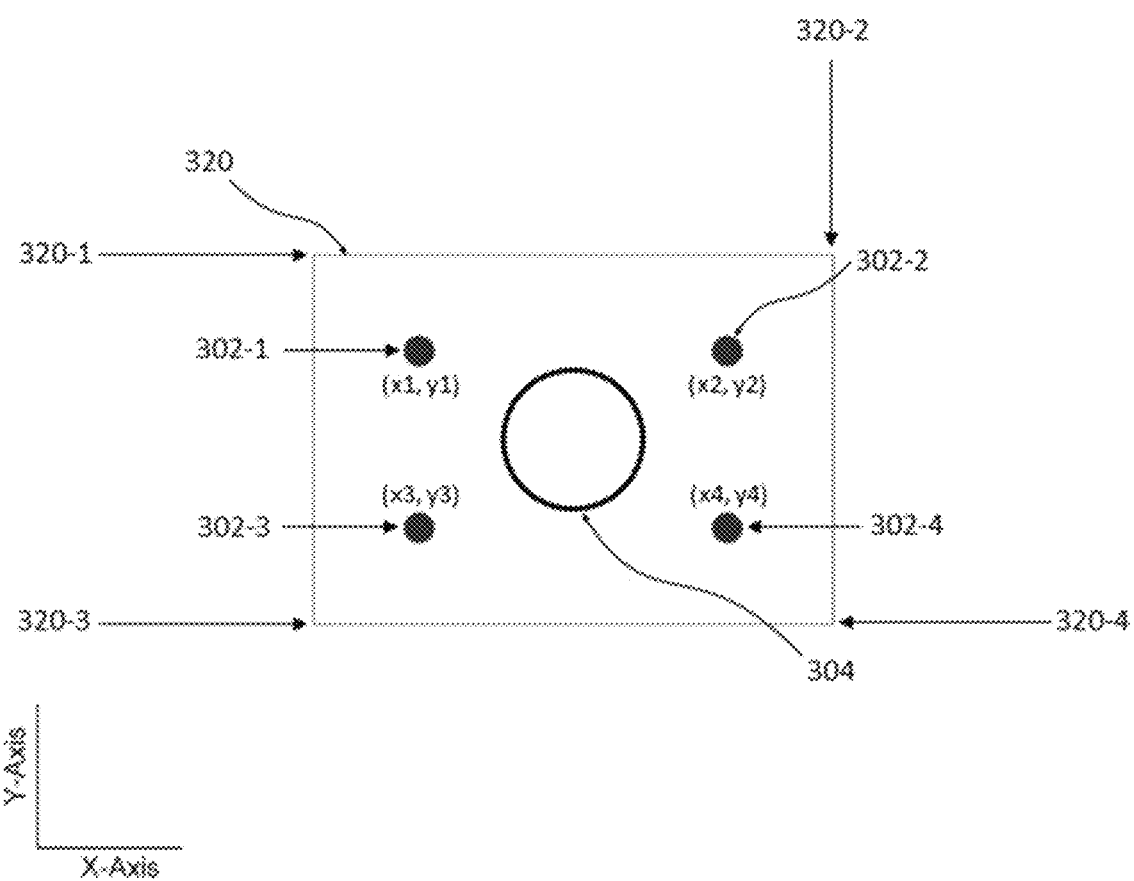

An implementation utilizing four light sources (e.g. LEDs) 302 for producing a photoinhibition layer 134 that illuminates an area with uniform intensity is described in more detail with reference to FIGS. 3A-3C. FIG. 3A is a schematic depicting an arrangement of four light sources 302-1, 302-2, 302-3, and 302-4 (e.g., LEDs) at respective positions (x1, y1), (x2, y2), (x3, y3), and (x4, y4). The four light sources 302-1, 302-2, 302-3, and 302-4 are arranged around a projection light source 304 on a platform 306. In some implementations, the platform 306 is separately supported on adjustable axis rails 314 from the projection light source 304 such that the platform 306 and the projection light source 304 are moved independently. The projection light source 304 can be a light projection device (e.g., light projection device 126) or a light projection device combined with projection optics (e.g., projection optics 130). For example, the projection light source 304 can be a projection lens and a DLP device.

FIG. 3B depicts a cross-sectional schematic of the platform 306 with optics from FIG. 3A, with exemplary beam paths 310 delineated for each light emitting device, and an exemplary beam path 312 delineated for the projection light source 304. In some implementations, the platform 306 is separately supported on adjustable axis rails 314 from the projection optics 130 such that the platform 306 and the projection optics 304 are moved independently.

FIG. 3C is a schematic depicting a top down view of a relative arrangement of the four LEDs 302-1, 302-2, 302-3, and 302-4 with respective to the projection light source 304 and a build area 320 within a liquid (e.g. liquid 104) in a reservoir (e.g. reservoir 102). The four LEDs 302 can be positioned directly below four corners 320-1, 320-2, 320-3, and 320-4 of the build area 320, respectively. Alternatively, the four LEDs 302 can be positioned below inner portions of the build area 320 at the respective positions (x1, y1), (x2, y2), (x3, y3), and (x4, y4), as illustrated in FIG. 3C.

The build area 320 may be defined based, in part, on a throw ratio of the projection light source 304 (e.g., a throw ratio for projection optics 132 or a light projection device 126). The throw ratio is defined as a ratio between a projection length 322 defined as a distance from the final lens in the projection light source 304 to a plane 324 and a width 326 of a projected beam (e.g., a projected image). The build area 320 is depicted in FIG. 3B along the x-axis, but it should be understood that the build area extends into the y-axis and is defined on an x-y plane. In some implementations, the build area described is located within the photoinitiation layer (e.g., the photoinitiation layer 130) in the liquid of the reservoir.

In some implementations, the projection light source 304 is only a light projection device 126 (and has no projection optics 132) such that the throw ratio is determined by the angular extent of light projection device 126 (e.g., the scan angle of a laser scanning system). In some implementations, the projection length 322 is determined by the focal length of the projection optics 304 and/or the light projection device (e.g., the DLP projector).

In some implementations each of the four LEDs 302 is arranged on the platform 306 such that a peak intensity from each LED 302 is at a corner of the build area 320. In some implementations, the location of each of the LEDs 302 is located directly underneath a corner of the build area 320, as is depicted in FIG. 3B. Once an arrangement for the four LEDs 302 on the platform 306 is determined, the platform 306 can be moved on the adjustable axis rails 314 to find an optimized platform-to-build area distance 328 between the platform 306 and the build area 320. The optimized distance for a distance 328 can include a distance at which the light sources 302 produce a uniform intensity of the photoinhibiting light within the build area 320. The platform-to-build area distance 328 can be determined using, in part, the method described with reference to FIGS. 2A and 2B.

In some implementations, the platform-to-build area distance 328 is determined by a location of the platform 306 with respect to the build area 320 where the build area is illuminated by a uniform intensity of photoinhibiting light produced by a combined intensity distribution (as described, for example, with reference to FIG. 2A) of the LEDs 302 within the build area 320. Additionally, the optimized platform-to-build area distance can be determined in part by an area of the build area 320 and a location of a photoinhibition layer (e.g., the photoinhibition layer 134) within a liquid in a reservoir (e.g., the liquid 104 in reservoir 102).

The relative position (e.g., vertical position) of the platform 306 and the build area 320 may be adjusted. In some examples, the platform 306 is moved and the build area 320 is kept stationary. As an alternative, the platform 306 is kept stationary and the build area 320 is moved. As another alternative, both the platform 306 and the build area 320 are moved.

In some implementations, prior to or during printing a 3D object, finding an optimized distance between the platform 306 and the build area in the liquid in the reservoir 102 can be achieved by moving the platform 306 along at least one axis perpendicular to the build area, moving the reservoir 102 along the axis perpendicular to the build area, or both. This may be performed, for example, by measuring light intensity in the build area as a function of light sources that project light into the build area. The light intensity may be measured using one or more sensors, such as, for example, a photodiode or a charge-coupled device (CCD) camera. Such light intensity may be used to generate an intensity distribution, which may include light intensity measured in the build area as a function of position of the platform relative to the build area.

Determining the platform-to-build area distance 328 corresponding to a uniform intensity of photoinhibiting light within the build area 320 can include measuring a combined intensity distribution within the build area 320 at various platform 306 positions along an axis perpendicular to the build area 320. Measuring the combined intensity distribution can include using a beam profiler or other light intensity versus spatial distribution measurement technique. The combined intensity distribution can also be measured using a spot photometer at various positions within the build area 320. Additionally, the combined intensity distribution within the build area 320 can be measured by imaging the build area 320 using a telecentric lens.

In some implementations, the photoinhibiting light produced by the LEDs 304 is of uniform intensity within the build area 320 and of attenuated intensity outside the build area 320.

Although the build area 320 described with reference to FIGS. 3A-3C is rectangular, a build area can also be of different shape including circular, ellipsoidal, triangular, or hexagonal. Additionally, though the example configuration described with reference to FIGS. 3A-3C utilized four LEDs 302 to produce uniform intensity in the build area 320, other numbers of LEDs or other light sources can be used (e.g., three LEDs, five LEDs, 6 LEDs, 8 LEDs, etc.).

Figure 4:
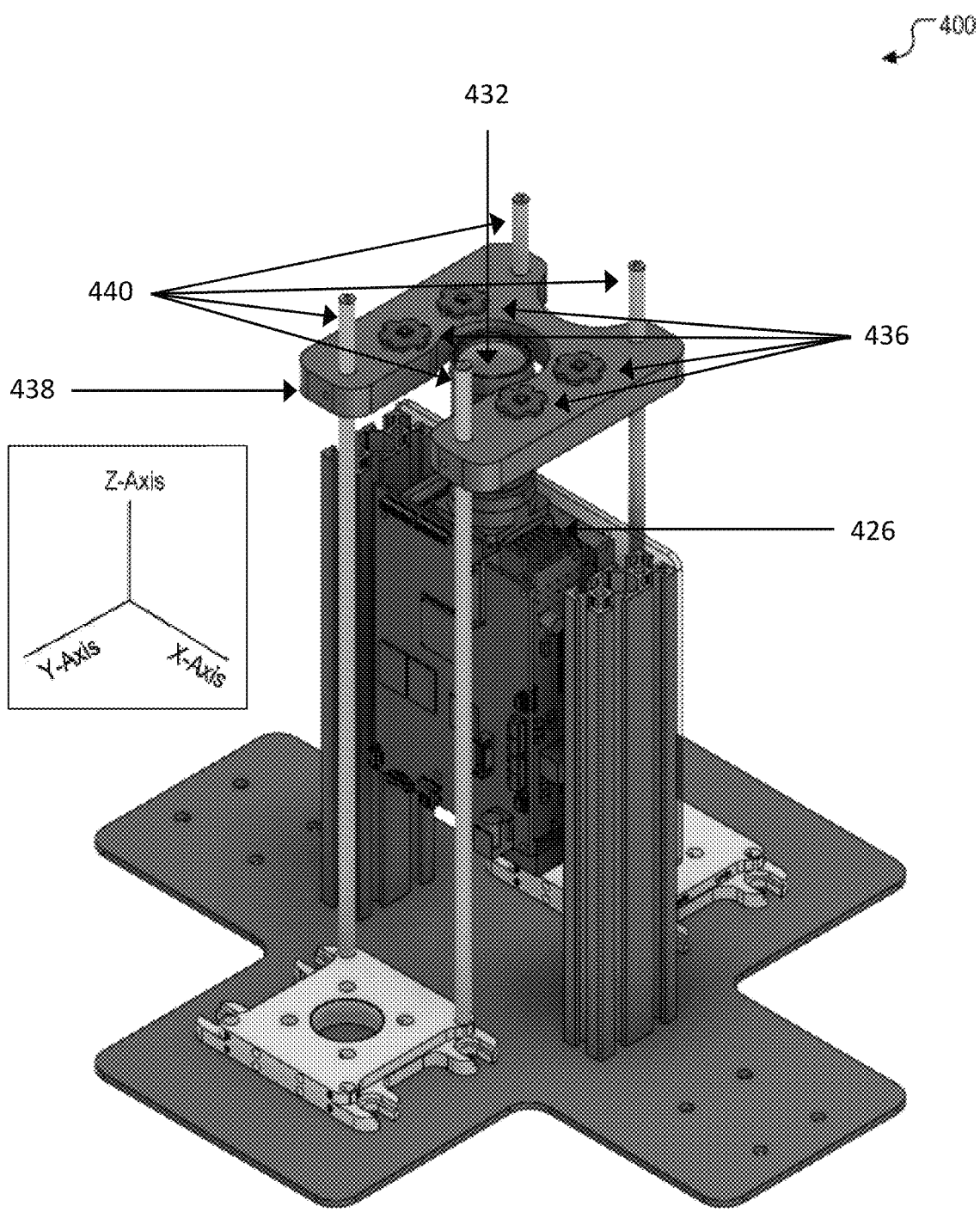
FIG. 4 shows an example schematic of a portion of a 3D printing system.

FIG. 4 is a partial depiction of a system 400 implementing a detailed example in accordance with the structures previously described with reference to FIGS. 1, 3A, and 3B. A projection light source 426 (e.g., DLP device) is oriented such that light emission through projection optics 432 is along the z-axis. A platform 438 surrounding the projection optics 432 includes four LEDs 436 on one planar surface of the platform 438 such that peak intensity of light emission from the LEDs 436 is along the z-axis. The platform 438 is supported in part by four adjustable z-axis rails 440.

Figure 5:
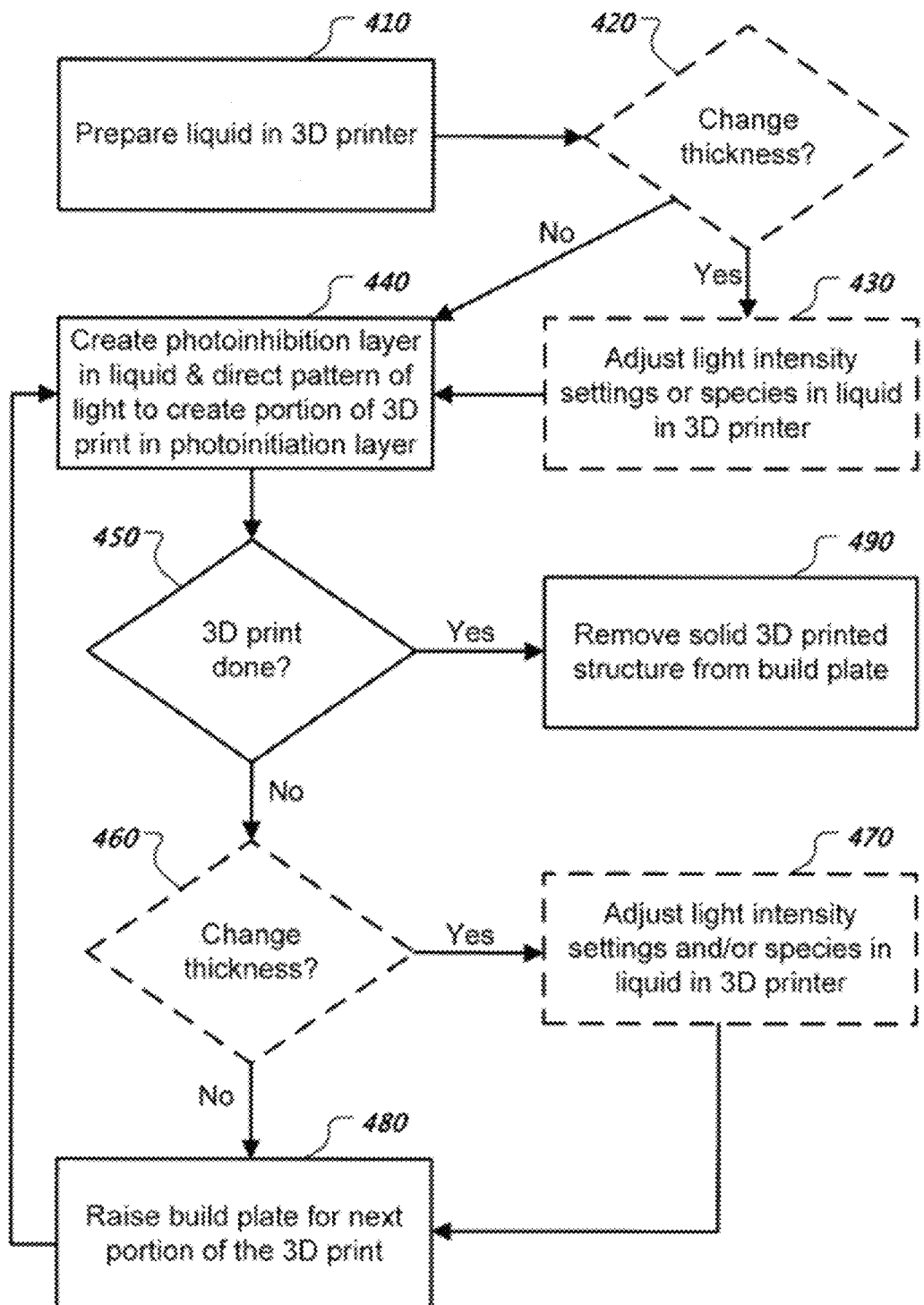
FIG. 5 shows an example of a process for 3D printing.

FIG. 5 shows an example of a process for 3D printing. A liquid 104 is prepared in a 3D printing system 100 within a reservoir 102 (410). The liquid 104 can include photoactive resins as well as photoactive species including photoinitiators and co-initiators and photoinhibitors. For example, a mixture of triethyleneglycol dimethacrylate (46% wt.), Genomer™ 1122 (Rahn, 38% wt.), Genomer™ 4230 (Rahn, 15% wt.) can be prepared in the reservoir 102 in the 3D printing system 100, and disulfiram (68 micromolar ($\mu$M)), camphorquinone (135 $\mu$M) ethyl 4-dimethylaminobenzoate (43 $\mu$M) can be added to this mixture. Other initial preparations are also possible.

In some implementations, a check can be made regarding a particular thickness for the layer to be printed on the 3D printed structure 108 (420). A change of thickness for the layer may be desirable, for example, if the nature of the 3D printed structure 108 requires a higher degree of detail (e.g., higher resolution or smaller features). A check can include identifying instructions from the 3D printing program 124 regarding the layer to be printed on the 3D printed structure 108.

The change in thickness can be achieved by adjusting the relative thickness(es) of the photoinitiation layer 130 and the photoinhibition layer 134 by altering an intensity and/or exposure time of the light sources 128 producing the photoinhibiting light, altering an intensity and/or exposure time of the projection light source 126, altering photoactive species (e.g., photoinitiator species and/or photoinhibitor species) in the liquid 104, or a combination thereof (430) Additionally, for a liquid 104 of a particular fixed composition, changing a thickness of a layer to be printed will then necessitate alterations of the light intensity settings of the photoinitiating and photoinhibiting lights.

A photoinhibition layer 134 is created within the liquid 104 using a second light from light sources 128, and a pattern of a first light from the light projection device 126 (or a projection light source 304) is directed through the photoinhibition layer 134 to create a 3D printed structure 108 on a build head 110 from the photoactive resin within a photoinitiation layer 130 of the liquid 104 (440). For example, the reservoir 102 can be illuminated through the window 106 by a set of 365 nanometer (nm) light emitting diodes (LEDs) (e.g., LEDs 136, LEDs 302) arranged to produce uniform intensity of 43 milliWatts per square centimeter (mW/cm$^2$) (as measured by a 365 nm probe) at the 365 nm wavelength within the photoinhibition layer 134. At the same time, a 2-dimensional pattern can be projected into the reservoir 102 through the window 106 using a DLP projection with a light intensity of the light projection device (including a 460 nm LED) being 19 mW/cm$^2$, as measured by a G&R Labs radiometer using a 420 nm probe.

The build head 110 is then moved through the liquid 104, with each successive layer of the 3D printed structure 108 being added, until the 3D printing process is complete (450). For each successive layer of the 3D printed structure 108, the build head 110 is raised (e.g., adjusted along an axis parallel to the direction of the added layers) in preparation for the next layer of the 3D printed structure to be built (480). In some implementations, the layers have a minimal thickness and can be treated as almost two dimensional, and the build head 110 is raised continuously (480) during the 3D printing, rather than in discrete steps.

In some implementations, a thickness of the photoinhibition layer, the photoinitiation layer, or both, is changed during the 3D printing process. In particular, this change of relative thicknesses can occur between successive layers of the build (460). For example, a thickness of the photoinhibition layer can be changed for one or more layers of the 3D printed structure 108 being printed. In this case, one or more light intensity settings for the 3D printing system 100 and/or one or more photoinitiation or photoinhibition species in the liquid 104 can be adjusted to effect layer thickness changes (470).

In some implementations, an intensity of one or more of the light sources 128 (or LEDs 302) and the light projection device 126 (or projection light source 304) can be adjusted using controllers 116, computer 118, or a combination thereof. Adjusting intensity can be done by adjusting a power input to the light emitting devices.

In some implementations, the photoinitiation wavelength is approximately 460 nm, and the photoinhibition wavelength is approximately 365 nm. By controlling the relative rates of reactions of the different photoactive species and photoactive resins, the overall rate of polymerization can be controlled. This process can thus be used to prevent polymerization from occurring at the resin-window interface and control the rate at which polymerization takes place in the direction normal to the resin-window interface.

A wide variety of other species and irradiation conditions can be used for the photoinhibition and photoinitiation processes. Non-limiting examples of the photoinitiator contemplated include benzophenones, thioxanthones, anthraquinones, benzoylformate esters, hydroxyacetophenones, alkylaminoacetophenones, benzil ketals, dialkoxyacetophenones, benzoin ethers, phosphine oxides acyloximino esters, alphahaloacetophenones, trichloromethyl-S-triazines, titanocenes, dibenzylidene ketones, ketocoumarins, dye sensitized photoinitiation systems, maleimides, and mixtures thereof. The photoinitiator can be used in amounts ranging from about 0.01 to about 25 weight percent (wt %) of the composition, and more preferably from about 0.1 to about 3.0 wt % of the composition. Non-limiting examples of co-initiators may include: primary, secondary, and tertiary amines; alcohols, and thiols.

Photoinitiators contemplated include: 1-hydroxy-cyclohexyl-phenyl-ketone (Irgacure™ 184; BASF, Hawthorne, N.J.); a 1:1 mixture of 1-hydroxy-cyclohexyl-phenyl-ketone and benzophenone (Irgacure™ 500; BASF); 2-hydroxy-2-methyl-1-phenyl-1-propanone (Darocur™ 1173; BASF); 2-hydroxy-1-[4-(2-hydroxyethoxy)phenyl]-2-methyl-1-propanone (Irgacure™ 2959; BASF); methyl benzoylformate (Darocur™ MBF; BASF); oxy-phenyl-acetic acid 2-[2-oxo-2-phenyl-acetoxy-ethoxy]-ethyl ester; oxy-phenyl-acetic 2-[2-hydroxy-ethoxy]-ethyl ester; a mixture of oxy-phenyl-acetic acid 2-[2-oxo-2-phenyl-acetoxy-ethoxy]-ethyl ester and oxy-phenyl-acetic 2-[2-hydroxy-ethoxy]-ethyl ester (Irgacure™ 754; BASF); alpha,alpha-dimethoxy-alpha-phenyl acetophenone (Irgacure™ 651; BASF); 2-benzyl-2-(dimethylamino)-1-[4-(4-morpholinyl)-phenyl]-1-butanone (Irgacure™ 369; BASF); 2-methyl-1-[4-(methylthio)phenyl]-2-(4-morpholinyl)-1-propanone (Irgacure™ 907; BASF); a 3:7 mixture of 2-benzyl-2-(dimethylamino)-1-[4-(4-morpholinyl) phenyl]-1-butanone and alpha,alpha-dimethoxy-alpha-phenylacetophenone per weight (Irgacure™ 1300; BASF); diphenyl-(2,4,6-trimethylbenzoyl) phosphine oxide (Darocur™ TPO; BASF); a 1:1 mixture of diphenyl-(2,4,6-trimethylbenzoyl)-phosphine oxide and 2-hydroxy-2-methyl-1-phenyl-1-propanone (Darocur™ 4265; BASF); phenyl bis(2,4,6-trimethyl benzoyl) phosphine oxide, which can be used in pure form (Irgacure™ 819; BASF, Hawthorne, N.J.) or dispersed in water (45% active, Irgacure™ 819DW; BASF); 2:8 mixture of phosphine oxide, phenyl bis(2,4,6-trimethyl benzoyl) and 2-hydroxy-2-methyl-1-phenyl-1-propanone (Irgacure™ 2022; BASF); Irgacure™ 2100, which comprises phenyl-bis(2,4,6-trimethylbenzoyl)-phosphine oxide); bis-(eta 5-2,4-cyclopentadien-1-yl)-bis-[2,6-difluoro-3-(1H-pyrrol-1-yl) phenyl]-titanium (Irgacure™ 784; BASF); (4-methylphenyl) [4-(2-methylpropyl) phenyl]-iodonium hexafluorophosphate (Irgacure™ 250; BASF); 2-(4-methylbenzyl)-2-(dimethylamino)-1-(4-morpholinophenyl)-butan-1-one (Irgacure™ 379; BASF); 4-(2-hydroxyethoxy)phenyl-(2-hydroxy-2-propyl)ketone (Irgacure™ 2959; BASF); bis-(2,6-dimethoxybenzoyl)-2,4,4-trimethylpentylphosphine oxide; a mixture of bis-(2,6-dimethoxybenzoyl)-2,4,4-trimethylpentylphosphine oxide and 2 hydroxy-2-methyl-1-phenyl-propanone (Irgacure™ 1700; BASF); 4-Isopropyl-9-thioxanthenone; and mixtures thereof.

Co-initiators can enhance the polymerization rate in some cases, and those contemplated include: isoamyl 4-(dimethylamino)benzoate, 2-ethylhexyl 4-(dimethylamino)benzoate; ethyl 4-(dimethylamino)benzoate; 3-(dimethylamino) propyl acrylate; 2-(dimethylamino)ethyl methacrylate; 4-(dimethylamino)benzophenones, 4-(diethylamino)benzophenones; 4,4'-Bis(diethylamino)benzophenones; methyl diethanolamine; triethylamine; hexane thiol; heptane thiol; octane thiol; nonane thiol; decane thiol; undecane thiol; dodecane thiol; isooctyl 3-mercaptopropionate; pentaerythritol tetrakis(3-mercaptopropionate); 4,4'-thiobisbenzenethiol; trimethylolpropane tris(3-mercaptopropionate); CN374 (Sartomer); CN371 (Sartomer), CN373 (Sartomer), Genomer 5142 (Rahn); Genomer 5161 (Rahn); Genomer (5271 (Rahn); Genomer 5275 (Rahn), and TEMPIC (Bruno Boc, Germany). The co-initiators can be used in amounts ranging from about 0.0 to about 25 weight percent (wt %) of the composition, and more preferably from about 0.1 to about 3.0 wt % of the composition.

A wide variety of radicals are known which tend to preferentially terminate growing polymer radicals, rather than initiating polymerizations. Classically, ketyl radicals are known to terminate rather than initiate photopolymerizations. Most controlled radical polymerization techniques utilize a radical species that selectively terminates growing radical chains. Examples may include the sulfanylthiocarbonyl and other radicals generated in photoiniferter polymerizations; the sulfanylthiocarbonyl radicals used in reversible addition-fragmentation chain transfer polymerization; and the nitrosyl radicals used in nitroxide mediate polymerization. Other non-radical species that can be generated to terminate growing radical chains may include the numerous metal/ligand complexes used as deactivators in atom-transfer radical polymerization (ATRP). Therefore, non-limiting examples of the photoinhibitor include thiocarbamates, xanthates, dithiobenzoates, photoinitiators that generate ketyl and other radicals that tend to terminate growing polymer chains radicals (i.e., camphorquinone and benzophenones), ATRP deactivators, and polymeric versions thereof. The photoinhibitor can be used in amounts ranging from about 0.01 to about 25 weight percent (wt %) of the composition, and more preferably from about 0.1 to about 3.0 wt % of the composition.

Photoinhibitors contemplated include: zinc dimethyl dithiocarbamate; zinc diethyl dithiocarbamate; zinc dibutyl dithiocarbamate; nickel dibutyl dithiocarbamate; zinc dibenzyl dithiocarbamate; tetramethylthiuram disulfide; tetraethylthiuram disulfide; tetramethylthiuram monosulfide; tetrabenzylthiuram disulfide; tetraisobutylthiuram disulfide; dipentamethylene thiuram hexasulfide; N,N'-dimethyl N,N'-di(4-pyridinyl)thiuram disulfide; 3-Butenyl 2-(dodecylthiocarbonothioylthio)-2-methylpropionate; 4-Cyano-4-[(dodecylsulfanylthiocarbonyl)sulfanyl]pentanoic acid; 4-Cyano-4-[(dodecylsulfanylthiocarbonyl)sulfanyl]pentanol; Cyanomethyl dodecyl trithiocarbonate; Cyanomethyl [3-(trimethoxysilyl)propyl] trithiocarbonate; 2-Cyano-2- propyl dodecyl trithiocarbonate; S,S-Dibenzyl trithiocarbonate; 2-(Dodecylthiocarbonothioylthio)-2-methylpropionic acid; 2-(Dodecylthiocarbonothioylthio)-2-methylpropionic acid N-hydroxysuccinimide; Benzyl 1H-pyrrole-1-carbodithioate; Cyanomethyl diphenylcarbamodithioate; Cyanomethyl methyl(phenyl)carbamodithioate; Cyanomethyl methyl(4-pyridyl)carbamodithioate; 2-Cyanopropan-2-yl N-methyl-N-(pyridin-4-yl)carbamodithioate; Methyl 2-[methyl(4-pyridinyl)carbamothioylthio]propionate; 1-Succinimidyl-4-cyano-4-[N-methyl-N-(4-pyridyl)carbamothioylthio]pentanoate; Benzyl benzodithioate; Cyanomethyl benzodithioate; 4-Cyano-4-(phenylcarbonothioylthio) pentanoic acid; 4-Cyano-4-(phenylcarbonothioylthio) pentanoic acid N-succinimidyl ester; 2-Cyano-2-propyl benzodithioate; 2-Cyano-2-propyl 4-cyanobenzodithioate; Ethyl 2-(4-methoxyphenylcarbonothioylthio)acetate; 2-Phenyl-2-propyl benzodithioate; Cyanomethyl methyl(4-pyridyl)carbamodithioate; 2-Cyanopropan-2-yl N-methyl-N-(pyridin-4-yl)carbamodithioate; and Methyl 2-[methyl(4-pyridinyl)carbamothioylthio]propionate.

A wide variety and non-limiting list of monomers that can be used include monomeric, dendritic, and oligomeric forms of acrylates, methacrylates, vinyl esters, styrenics, other vinylic species, and mixtures thereof. Monomers contemplated include: hydroxyethyl methacrylate; n-Lauryl acrylate; tetrahydrofurfuryl methacrylate; 2,2,2-trifluoroethyl methacrylate; isobornyl methacrylate; polypropylene glycol monomethacrylates, aliphatic urethane acrylate (i.e., Rahn Genomer 1122); hydroxyethyl acrylate; n-Lauryl methacrylate; tetrahydrofurfuryl acrylate; 2,2,2-trifluoroethyl acrylate; isobornyl acrylate; polypropylene glycol monoacrylates; trimethylpropane triacrylate; trimethylpropane trimethacrylate; pentaerythritol tetraacrylate; pentaerythritol tetraacrylate; triethyleneglycol diacrylate; triethylene glycol dimethacrylate; tetrathyleneglycol diacrylate; tetrathylene glycol dimethacrylate; neopentyldimethacrylate; neopentylacrylate; hexane dioldimethacylate; hexane diol diacrylate; polyethylene glycol 400 dimethacrylate; polyethylene glycol 400 diacrylate; diethylglycol diacrylate; diethylene glycol dimethacrylate; ethyleneglycol diacrylate; ethylene glycol dimethacrylate; ethoxylated bis phenol A dimethacrylate; ethoxylated bis phenol A diacrylate; bisphenol A glycidyl methacrylate; bisphenol A glycidyl acrylate; ditrimethylolpropane tetraacrylate; and ditrimethylolpropane tetraacrylate.

Dyes can be used to both attenuate light and to transfer energy to photoactive species increasing the sensitivity of the system to a given wavelength for either or both photoinitiation and photoinhibition processes. The concentration of the chosen dye is highly dependent on the light absorption properties of the given dye and ranges from about 0.001 to about 5 weight percent (wt %) of the composition. Useful classes of dyes include compounds commonly used as UV absorbers for decreasing weathering of coatings including, such as, 2-hydroxyphenyl-benzophenones; 2-(2-hydroxyphenyl)-benzotriazoles; and 2-hydroxyphenyl-s-triazines. Other useful dyes include those used for histological staining or dying of fabrics. A non-limiting list may include: Martius yellow, Quinoline yellow; Sudan red, Sudan I, Sudan IV, eosin, eosin Y, neutral red, and acid red. Pigments can also be used to scatter and attenuate light.

The general concept is not necessarily limited to radical based photopolymerizations, and can also be applied to cationic photopolymerizations of allylic, epoxide, oxetane, and other monomers. In such implementations, cationic photoinitiators such as triphenylsulphonium salts, diphenyliodonium salts, or diaryliodonium salts may be used to generate a propagating cationic center and polymerize the monomer. Photoinhibition may be accomplished using a photobase generator such as, PL-1, or PL-2, Irgacure 369, or Irgacure 907 (BASF products), to neutralize the propagating cation. Alternatively, an alcohol or other chain transfer agent can be generated which may significantly delay gelation. Such a process can be accomplished using functional groups that are liberated by the photochemical removal of ortho-nitrobenzyl groups or fluorenylmethyloxycarbonyl carbamate.

A number of embodiments of the invention have been described. Nevertheless, it will be understood that various modifications may be made without departing from the spirit and scope of the invention.

Embodiments of the subject matter and the functional operations described in the present disclosure can be implemented in digital electronic circuitry, or in computer software, firmware, or hardware, including the structures disclosed in the present disclosure and their structural equivalents, or in combinations of one or more of them. Embodiments of the subject matter described in the present disclosure can be implemented using one or more modules of computer program instructions encoded on a computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer readable medium can be a machine-readable storage device, a machine-readable storage substrate, a memory device, or a combination of one or more of them.

The term "data processing apparatus" encompasses all apparatus, devices, and machines for processing data, including by way of an example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

Memory can include both volatile and non-volatile memory, such as Random Access Memory (RAM) and Flash RAM.

A computer program (also known as a program, software, software application, script, or code) can be written in any form of programming language, including compiled or interpreted languages, declarative or procedural languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in the present disclosure can be performed by, and/or under the control of, one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of an example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of an example semiconductor memory devices, e.g., erasable programmable read-only memory (EPROM), electrically erasable programmable read-only memory (EEPROM), and flash memory devices; magnetic disks, e.g., internal hard disks or removable disks; magneto optical disks; and compact disc read-only memory (CD ROM) and digital video disc read-only memory (DVD-ROM) disks. The processor and the memory can be supplemented by, or incorporated in, special purpose logic circuitry.

To provide for interaction with a user, embodiments of the subject matter described in the present disclosure can be implemented on a computer having a display device, e.g., LCD (liquid crystal display), OLED (organic light emitting diode) or other monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in the present disclosure can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in the present disclosure, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other.

While the present disclosure contains many implementation details, these should not be construed as limitations on the scope of the invention or of what may be claimed, but rather as descriptions of features specific to particular embodiments of the invention. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method for printing a three dimensional (3D) object, comprising:
    (1) providing (i) a reservoir comprising a liquid comprising a photoactive resin, and (ii) a build head, wherein said build head is movable within said reservoir during printing of said 3D object;
    (2) using a light projection device to project a photoinitiation light beam into a build area within said liquid in said reservoir and in accordance with a computer model of said 3D object, wherein said build area is defined at least in part by a throw ratio, and wherein said photoinitiation light beam comprises a first wavelength selected to induce photoinitiation of said photoactive resin within a photoinitiation layer in said liquid to form at least a portion of said 3D object adjacent to said build head; and
    (3) using a plurality of light sources to project a plurality of photoinhibition light beams into said build area within said liquid in said reservoir, wherein each of said plurality of photoinhibition light beams comprises a second wavelength selected to induce photoinhibition of said photoactive resin within a photoinhibition layer in said liquid, and wherein each of said plurality of photoinhibition light beams is projected at a peak intensity in a different respective position in said build area.

2. The method of claim 1, wherein said photoinitiation light beam is projected into said build area as patterned light, and wherein said plurality of photoinhibition light beams is projected into said build area as flood light.

3. The method of claim 1, further comprising iteratively projecting said photoinitiation light beam into said build area and raising said build head, and changing a thickness of said photoinhibition layer at least in part by adjusting an intensity of said plurality of photoinhibition light beams during printing of said 3D object.

4. The method of claim 3, wherein adjusting said intensity of said plurality of photoinhibition light beams comprises varying power input to one or more light sources of said plurality of light sources.

5. The method of claim 1, wherein during printing of said 3D object, photoinhibition light beams of said plurality of photoinhibition light beams overlap to yield a uniform projection of said plurality of photoinhibition light beams within said build area.

6. The method of claim 1, further comprising selecting a composition of said liquid to include at least one of (i) one or more photoinhibitor species, and (ii) one or more photoinitiator species.

7. The method of claim 6, further comprising adjusting an intensity of said plurality of photoinhibition light beams based at least in part on an amount or concentration of said one or more photoinhibitor species.

8. The method of claim 7, further comprising adjusting an intensity of said plurality of photoinhibition light beams based at least in part on a type of said one or more photoinhibitor species.

9. The method of claim 1, further comprising adjusting an intensity of said photoinitiation light beam during printing of said 3D object.

10. The method of claim 1, wherein said first wavelength and said second wavelength are different.

11. A system for printing a three dimensional (3D) object, comprising:
    a reservoir configured to hold a liquid comprising a photoactive resin;
    a build head configured to support said 3D object, wherein said build head is configured to move within said reservoir during printing of said 3D object;
    a light projection device arranged with respect to said reservoir and configured to project a photoinitiation light beam into a build area within said liquid in said reservoir and in accordance with a computer model of said 3D object, wherein said build area is defined at least in part by a throw ratio, and wherein said photoinitiation light beam comprises a first wavelength selected to induce photoinitiation of said photoactive resin within a photoinitiation layer in said liquid to form at least a portion of said 3D object adjacent to said build head;
    a plurality of light sources each arranged with respect to said reservoir and configured to project a plurality of photoinhibition light beams into said build area within said liquid in said reservoir, wherein said plurality of photoinhibition light beams comprises a second wavelength selected to induce photoinhibition of said photoactive resin within a photoinhibition layer in said liquid; and
    a controller operatively coupled to said light projection device and said plurality of light sources, wherein said controller is programmed to (i) direct said light projection device to project said photoinitiation light beam into said build area, and (ii) direct said plurality light sources to project said plurality of photoinhibition light beams into said build area, wherein each of said plurality of photoinhibition light beams is projected at a peak intensity in a different respective position in said build area.

12. The system of claim 11, wherein said photoinitiation light beam is a patterned light and said plurality of photoinhibition light beams is flood light.

13. The system of claim 11, wherein said plurality of light sources is configured to project photoinhibition light beams of said plurality of photoinhibition light beams, wherein said photoinhibition light beams overlap to yield a uniform projection of said plurality of photoinhibition light beams within said build area.

14. The system of claim 11, wherein said controller is programmed to adjust an intensity of said photoinitiation light beam projected by said light projection device.

15. The system of claim 11, wherein said plurality of light sources includes light emitting diodes.

16. The system of claim 11, wherein said build area is further defined by one or more projection optics and a projected image resolution achievable using said first wavelength of said photoinitiation light beam with said one or more projection optics.

17. A method for printing a three dimensional (3D) object, comprising:
    (a) providing (i) a reservoir comprising a liquid comprising a photoactive resin, and (ii) a build head, wherein said build head is movable within said reservoir during printing of said 3D object;
    (b) using a light projection device to project a photoinitiation light beam into a build area within said liquid in said reservoir and in accordance with a computer model of said 3D object, and wherein said photoinitiation light beam comprises a first wavelength selected to induce photoinitiation of said photoactive resin within a photoinitiation layer in said liquid to form at least a portion of said 3D object adjacent to said build head; and
    (c) using one or more light sources supported on a platform to project a photoinhibition light beam into said build area within said liquid in said reservoir, wherein said photoinhibition light beam comprises a second wavelength selected to induce photoinhibition of said photoactive resin within a photoinhibition layer in said liquid, wherein prior to or during printing of said 3D object, a position of said platform relative to said build area is changed along at least one axis perpendicular to said build area, while a distance between said light projection device and said build area remains substantially constant, to achieve a uniform intensity of said photoinhibition light beam within said build area.

18. The method of claim 17, further comprising subjecting said platform to relative motion independently from one or more projection optics of said light projection device.

19. The method of claim 17, wherein said platform mitigates excess heat produced by at least said one or more light sources on said platform.

20. The method of claim 17, further comprising (i) subjecting said platform to relative motion along said at least one axis perpendicular to said build area, and (ii) measuring an intensity distribution of said photoinhibition light beam projected from said one or more light sources.

21. The method of claim 17, wherein said photoinitiation light beam is projected into said build area as patterned light, and wherein said photoinhibition light beam is projected into said build area as flood light.

22. A system for printing a three dimensional (3D) object, comprising:
 a reservoir configured to hold a liquid comprising a photoactive resin;
 a build head configured to support said 3D object, wherein said build head is configured to move within said reservoir during printing of said 3D object;
 a light projection device arranged with respect to said reservoir and configured to project a photoinitiation light beam into a build area within said liquid in said reservoir and in accordance with a computer model of said 3D object, and wherein said photoinitiation light beam comprises a first wavelength selected to induce photoinitiation of said photoactive resin within a photoinitiation layer in said liquid to form at least a portion of said 3D object adjacent to said build head;
 one or more light sources supported on a platform, wherein said one or more light sources are each arranged with respect to said reservoir and configured to project a photoinhibition light beam into said build area within said liquid in said reservoir, wherein said photoinhibition light beam comprises a second wavelength selected to induce photoinhibition of said photoactive resin within a photoinhibition layer in said liquid; and
 a controller operatively coupled to said light projection device and said one or more light sources, wherein said controller is programmed to (i) prior to or during printing of said 3D object, change a position of said platform relative to said build area along at least one axis perpendicular to said build area to achieve a uniform intensity of said photoinhibition light beam within said build area, while a distance between said light projection device and said build area remains substantially constant, (ii) direct said light projection device to project said photoinitiation light beam into said build area, and (iii) direct said one or more light sources to project said photoinhibition light beam into said build area at said uniform intensity of said photoinhibition light beam within said build area.

23. The system of claim 22, wherein said platform comprises a heat sink to mitigate excess heat produced by at least said one or more light sources on said platform.

24. The system of claim 22, wherein said controller is programmed to adjust a relative position of said platform to an optimized distance from said build area, wherein said optimized distance is determined at least in part by an area of said build area and a location of said photoinhibition layer.

25. The system of claim 22, wherein said controller is programmed to subject said platform to relative motion independently from one or more projection optics of said light projection device.

26. The method of claim 1, wherein each of said plurality of photoinhibition light beams is projected at said peak intensity in a different respective corner of a plurality of corners of said build area.

27. The system of claim 11, wherein each of said plurality of photoinhibition light beams is projected at said peak intensity in a different respective corner of a plurality of corners of said build area.

28. The system of claim 11, wherein said controller is programmed to (i) vary power input to one or more of said plurality of light sources to adjust an intensity of said one or more of said plurality of light sources or (ii) vary an exposure time of said one or more of said plurality of light sources.

* * * * *